US012402463B2

(12) United States Patent
Li et al.

(10) Patent No.: US 12,402,463 B2
(45) Date of Patent: Aug. 26, 2025

(54) DISPLAY DEVICE CONNECTING LIGHT EMITTING ELEMENTS TO FIRST AND SECOND CONTACT ELECTRODES VIA THIRD CONTACT ELECTRODE

(71) Applicant: Samsung Display Co. Ltd., Yongin-si (KR)

(72) Inventors: Xin Xing Li, Suwon-Si (KR); Tae Jin Kong, Suwon-Si (KR); Hee Keun Lee, Suwon-Si (KR); Hyun Min Cho, Seoul (KR); Chang Il Tae, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 664 days.

(21) Appl. No.: 17/502,829

(22) Filed: Oct. 15, 2021

(65) Prior Publication Data

US 2022/0037397 A1 Feb. 3, 2022

Related U.S. Application Data

(63) Continuation of application No. 16/461,780, filed as application No. PCT/KR2019/000530 on Jan. 14, 2019, now Pat. No. 11,152,424.

(30) Foreign Application Priority Data

Aug. 1, 2018 (KR) ........................ 10-2018-0089839

(51) Int. Cl.
*H10H 29/14* (2025.01)
*H10H 20/831* (2025.01)
(Continued)

(52) U.S. Cl.
CPC ........ *H10H 29/142* (2025.01); *H10H 20/831* (2025.01); *H10H 20/84* (2025.01); *H10H 20/857* (2025.01); *H10H 20/856* (2025.01)

(58) Field of Classification Search
CPC ....... H01L 27/156; H01L 33/38; H01L 33/44; H01L 33/62; H01L 33/60; H10H 29/142;
(Continued)

(56) References Cited

U.S. PATENT DOCUMENTS 9,229,236 B2 1/2016 Hino et al.
9,287,242 B2 3/2016 Shibata et al.
(Continued)

FOREIGN PATENT DOCUMENTS

CN 107623013 1/2018
CN 112437986 3/2021
(Continued)

OTHER PUBLICATIONS

International Search Report corresponding to International Application No. PCT/KR2019/000530 dated Apr. 30, 2019.
(Continued)

*Primary Examiner* — Eric W Jones
(74) *Attorney, Agent, or Firm* — KILE PARK REED & HOUTTEMAN PLLC

(57) ABSTRACT

A display device includes at least one first and second electrodes extending in a first direction, at least one first and second light emitting elements disposed therebetween, a first contact electrode partially covering the first electrode and contacting a first end of the first light emitting element, a second contact electrode partially covering the second electrode and contacting a third end of the second light emitting element, and a third contact electrode disposed between the first and second contact electrodes and contacting a second end of the first light emitting element and a fourth end of the second light emitting element, in which a distance between the first and second electrodes is greater than a longitudinal length of at least one of the first and second light emitting
(Continued)

elements, and the first and second light emitting elements are connected in series between the first and second electrodes.

24 Claims, 22 Drawing Sheets

(51) Int. Cl.
*H10H 20/84* (2025.01)
*H10H 20/856* (2025.01)
*H10H 20/857* (2025.01)

(58) Field of Classification Search
CPC .... H10H 20/831; H10H 20/84; H10H 20/857; H10H 20/856
USPC .......................................................... 257/88
See application file for complete search history.

(56) References Cited

U.S. PATENT DOCUMENTS 9,570,425 B2 2/2017 Do
10,211,418 B2 2/2019 Im et al.
10,825,393 B2 * 11/2020 Kim .................... G09G 3/3233
2008/0251381 A1 10/2008 Shibata et al.
2011/0254043 A1 10/2011 Negishi et al.
2012/0146066 A1 6/2012 Tischler et al.
2017/0179192 A1 6/2017 Zhang et al.
2018/0019369 A1 1/2018 Cho et al.
2018/0111829 A1 4/2018 Sam et al.
2018/0122837 A1 * 5/2018 Kang ..................... H01L 33/38
2018/0174519 A1 * 6/2018 Kim ..................... H01L 27/156
2018/0175009 A1 6/2018 Kim et al.
2018/0287010 A1 * 10/2018 Sung .................... B82B 3/0066
2019/0181301 A1 * 6/2019 Kim ....................... H01L 33/44
2019/0385991 A1 * 12/2019 Kim ..................... H01L 25/167

FOREIGN PATENT DOCUMENTS

JP 2011-103435 5/2011
JP 2011-205060 10/2011
KR 10-2013-0080412 7/2013
KR 10-2014-0085331 7/2014
KR 10-1436123 11/2014
KR 10-2016-0059574 5/2016
KR 10-2018-0007376 1/2018
KR 10-2018-0009015 1/2018
KR 10-2018-0072909 7/2018
KR 10-2018-0081378 7/2018

OTHER PUBLICATIONS

Written Opinion corresponding to International Application No. PCT/KR2019/000530, dated Apr. 30, 2019.

* cited by examiner

DISPLAY DEVICE CONNECTING LIGHT EMITTING ELEMENTS TO FIRST AND SECOND CONTACT ELECTRODES VIA THIRD CONTACT ELECTRODE

CROSS REFERENCE TO RELATED APPLICATION(S)

This is a continuation application of U.S. patent application Ser. No. 16/461,780, filed May 16, 2019, now U.S. Pat. No. 11,152,424 issued Oct. 19, 2021, the disclosure of which is incorporated herein by reference in its entirety. U.S. patent application Ser. No. 16/461,780 claims priority to and benefit of International Application No. PCT/KR2019/000530, filed on Jan. 14, 2019, which claims under 35 U.S.C. § 119 (a) and 365(b) priority to and benefits of Korean Patent Application No. 10-2018-0089839, filed on Aug. 1, 2018 in the Korean Intellectual Property Office, the entire contents of which are incorporated herein by reference.

BACKGROUND

Field

Exemplary embodiments of the invention relate generally to a display device, and, more specifically, to a display device including an inorganic light emitting diode array.

Discussion of the Background

The importance of a display device has increased with the development of multimedia. Accordingly, various types of display devices such as an organic light emitting display (OLED) and a liquid crystal display (LCD) have been used.

A display device is a device for displaying an image, and includes a display panel, such as a light emitting display panel or a liquid crystal panel. The light emitting display panel may include light emitting elements, such as light emitting diodes (LEDs). Light emitting diodes (LEDs) may include an organic light emitting diode (OLED) using an organic material as a fluorescent material, and an inorganic light emitting diode using an inorganic material as a fluorescent material.

An organic light emitting diode (OLED) can be manufactured through a relatively simple manufacturing process, and its usage of an organic material as a fluorescent material provides flexible characteristics. However, the organic material is known to be vulnerable to high-temperature driving environments and have a relatively low efficiency with blue light.

On the other hand, an inorganic light emitting diode generally has more durability even in high-temperature environments and higher efficiency with blue light than an organic light emitting diode because it uses an inorganic semiconductor as a fluorescent material. Further, various processes for simplifying the manufacture of an inorganic light emitting diode have been developed, such as transfer methods using dielectrophoresis (DEP). As such, research on inorganic light emitting diodes having improved durability and efficiency than organic light emitting diodes is being continued.

The above information disclosed in this Background section is only for understanding of the background of the inventive concepts, and, therefore, it may contain information that does not constitute prior art.

SUMMARY

Display devices constructed according to exemplary embodiments of the invention are capable of reducing the capacity of a driving transistor, improving voltage distribution efficiency, and reducing the power loss due to wire resistance by forming the wirings of light emitting elements in series.

Additional features of the inventive concepts will be set forth in the description which follows, and in part will be apparent from the description, or may be learned by practice of the inventive concepts.

According to an aspect of the invention, a display device includes at least one first electrode and at least one second electrode extending in a first direction and spaced apart from each other in a second direction different from the first direction, at least one first light emitting element and at least one second light emitting element disposed between the first electrode and the second electrode, a first contact electrode partially covering the first electrode and contacting a first end of the first light emitting element, a second contact electrode spaced apart from the first contact electrode, partially covering the second electrode, and contacting a third end of the second light emitting element and a third contact electrode disposed between the first contact electrode and the second contact electrode and contacting a second end of the first light emitting element and a fourth end of the second light emitting element, in which a distance between the first electrode and the second electrode is greater than a longitudinal length of at least one of the first light emitting element and the second light emitting element, and the first light emitting element and the second light emitting element are connected in series between the first electrode and the second electrode.

The distance between the first electrode and the second electrode may be less than about 2 times of the longitudinal length of at least one of the first light emitting element and the second light emitting element.

A width of the third contact electrode may be less than the distance between the first contact electrode and the second contact electrode, and be greater than the longitudinal length of at least one of the first light emitting element and the second light emitting element.

The first light emitting element may include a plurality of first light emitting elements spaced apart from each other in the first direction, and the second light emitting element may include a plurality of second light emitting elements spaced apart from each other in the first direction.

The second end of at least one of the first light emitting elements and the fourth end of at least one of the second light emitting elements face each other.

The first light emitting elements and the second light emitting elements may be aligned to face each other along the second direction.

The second end of the first light emitting elements and the fourth end of the second light emitting elements may be substantially aligned along the first direction, and at least one of the first light emitting elements and at least one of the second light emitting elements may be disposed to partially overlap each other in the first direction.

Each of the first light emitting element and the second light emitting element may include a first conductive semiconductor layer, an active layer, and a second conductive semiconductor layer, one of the first conductive semiconductor layer and the second conductive semiconductor layer may be a p-type conductive semiconductor layer, and the other one thereof is an n-type conductive semiconductor layer, and the second end of the first light emitting element and the fourth end of the second light emitting element may have different types of conductive semiconductor layers.

According to another aspect of the invention, a display device includes a first conductive electrode layer including a first electrode and a second electrode spaced apart from the first electrode, a first light emitting element having one end electrically connected to the first electrode and a second light emitting element having one end electrically connected to the second electrode, a second conductive electrode layer including a first contact electrode disposed on the first electrode and contacting the one end of the first light emitting element and a second contact electrode disposed on the second electrode and contacting the one end of the second light emitting element and a third conductive electrode layer including a third contact electrode contacting the other end of the first light emitting element and the other end of the second light emitting element, wherein the first conductive electrode layer is in contact with the second conductive electrode layer, and the first light emitting element and the second light emitting element are connected in series between the first electrode and the second electrode.

The other end of the first light emitting element and the other end of the second light emitting element, which are in contact with the third conductive electrode layer face each other.

The display device may further include a first insulating layer disposed to cover a part of the first conductive electrode layer, wherein at least a part of the first insulating layer may be in contact with the second conductive electrode layer and the third conductive electrode layer.

The second conductive electrode layer and the third conductive electrode layer may be disposed on substantially the same layer.

The display device may further include a second insulating layer disposed between the second conductive electrode layer and the third conductive electrode layer.

At least a part of a lower surface of the insulating layer may be in contact with the second conductive electrode layer, and at least a part of an upper surface thereof may be in contact with the third conductive electrode layer.

At least a part of a lower surface of the insulating layer may be in contact with the third conductive electrode layer, and at least a part of an upper surface thereof may be in contact with the second conductive electrode layer.

According to the other aspect of the invention, a display device includes a first electrode connected to a thin film transistor, a second electrode connected to a common power supply wiring, at least one first light emitting diode having one end electrically connected to the first electrode, at least one second light emitting diode having one end electrically connected to the second electrode, a first contact electrode partially covering the first electrode and contacting the one end of the first light emitting diode, a second contact electrode partially covering the second electrode and contacting the one end of the second light emitting diode and a floating electrode disposed between the first contact electrode and the second contact electrode and contacting the other end of the first light emitting diode and the other end of the second light emitting diode, wherein the first light emitting diode and the second light emitting diode are connected in series between the first electrode and the second electrode.

The first contact electrode, the second contact electrode, and the floating electrode may extend substantially in a first direction, and the first light emitting diode and the second light emitting diode may be longitudinally disposed along a second direction intersecting the first direction.

Each of the first light emitting diode and the second light emitting diode may include a first conductive semiconductor layer, an active layer, and a second conductive semiconductor layer, any one of the first conductive semiconductor layer and the second conductive semiconductor layer may be a p-type conductive semiconductor layer, and the other one thereof is an n-type conductive semiconductor layer, the first conductive semiconductor layer of the first light emitting diode may be electrically connected to the first electrode, the second conductive semiconductor layer of the first light emitting diode may be electrically connected to the floating electrode, the first conductive semiconductor layer of the second light emitting diode may be electrically connected to the floating electrode, and the second conductive semiconductor layer of the second light emitting diode may be electrically connected to the second electrode.

The first electrode and the second electrode may be spaced apart from each other, and a distance between the first electrode and the second electrode may be less than about 2 times of a longitudinal length of at least one of the first light emitting diode and the second light emitting diode.

The longitudinal length of at least one of the first light emitting diode and the second light emitting diode may be about 3 μm to 6 about μm.

Accordingly, display devices constructed according to exemplary embodiments of the invention may include light emitting elements, both ends of each which are electrically connected to a first electrode and a third contact electrode or are electrically connected to a third contact electrode and a second electrode. The light emitting elements may be partially connected in series, thereby improving voltage distribution efficiency, the capacity design of a thin film transistor, and the loss due to the wire resistance, in the driving of the display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
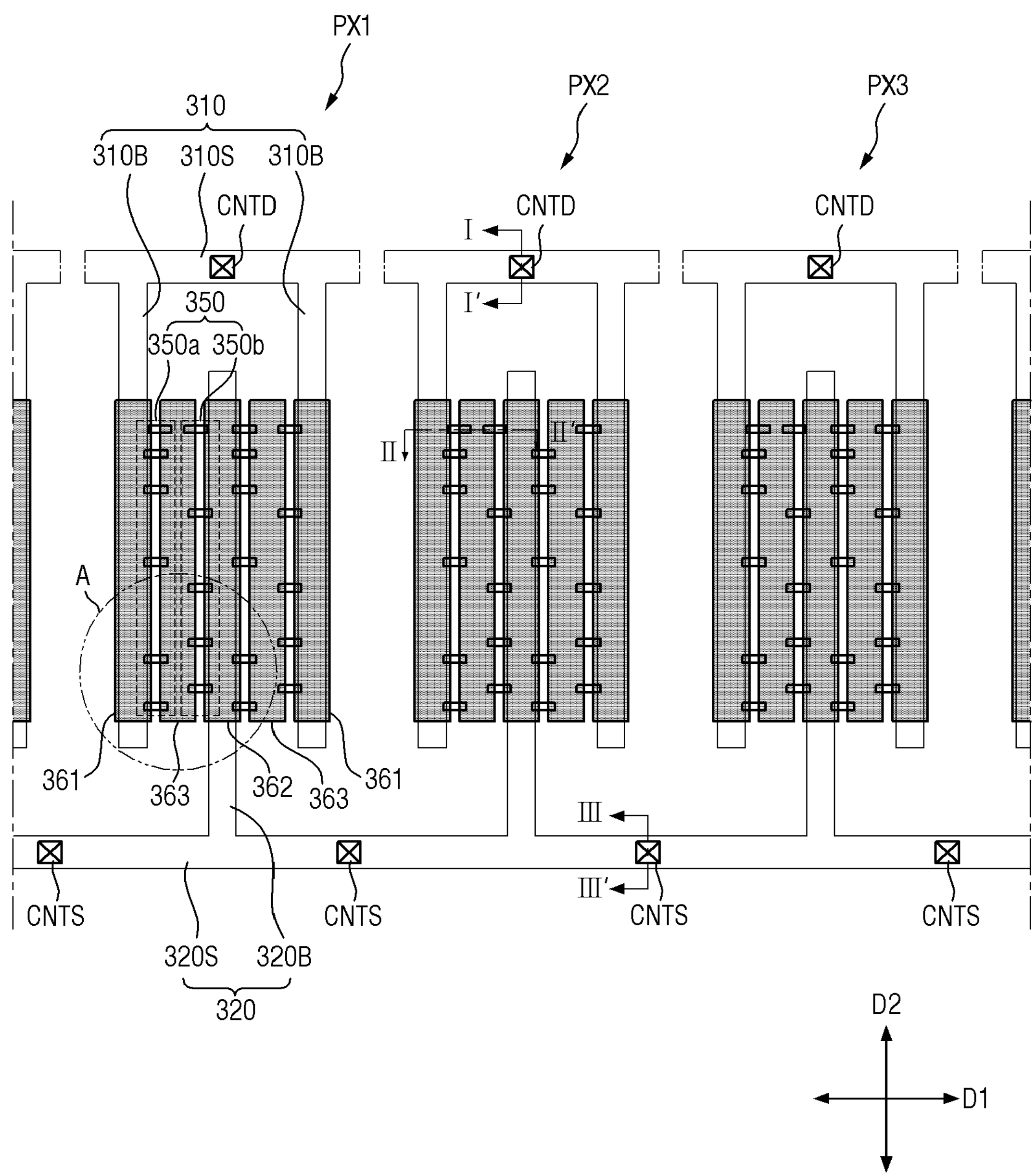
FIG. 1 is a plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of an exemplary embodiment of a display device constructed according to the principles of the invention.

A display device 10 may include at least one region defined as a pixel PX. A plurality of pixels PX may be arranged in a display unit of the display device 10 to emit light having a specific wavelength band to the outside of the display device 10. FIG. 1 exemplarily illustrates three pixels PX1, PX2, and PX3, but the inventive concepts are not limited to a particular number of pixels PX in the display device 10. FIG. 1 also exemplarily shows that a plurality of pixels PX are arranged only in one direction, for example, in a first direction D1, however, in some exemplary embodiments, the plurality of pixels PX may be arranged in a second direction D2 intersecting the first direction D1. Further, at least one or more pixels PX shown in FIG. 1 may be formed together as one pixel PX. In some exemplary embodiments, the pixels may be arranged substantially in a vertical direction (or second direction D2) or in a zigzag form, rather than being arranged in parallel in the first direction D1 as shown in FIG. 1.

The display device 10 may include a light emitting area where light emitting elements are arranged to emit light of a specific color, and a non-light emitting area defined as an area other than the light emitting area. The non-light emitting area may be covered by at least one member so as not to be seen from the outside. The non-light emitting area may be provided with various members for driving the light emitting elements arranged in the light emitting area. For example, the non-light emitting area may be provided with a wiring for applying an electrical signal to the light emitting area, a circuit unit, a driving unit, and the like. However, the inventive concepts are not limited thereto.

Each of the plurality of pixels PX may include at least one light emitting element 350 emitting light having a specific wavelength band to display a color. Light emitted from the light emitting element 350 may be viewed from the outside of the display device 10. In an exemplary embodiment, light emitting elements 350 emitting light of different colors from each other, for example, red, green, and blue colors, may be provided for each of the pixels PX to display colors different from each other. However, the inventive concepts are not limited thereto, and in some exemplary embodiments, pixels PX displaying different colors from each other may include light emitting elements 350 emitting light of the same color (for example, blue), and the colors of the respective pixels PX may be displayed by providing a wavelength conversion layer or a color filter on a light emitting path. In another exemplary embodiment, adjacent pixels PX may emit light of the same color.

Referring to FIG. 1, the display device 10 may include a plurality of electrodes 310 and 320 and a plurality of light emitting elements 350. At least a part of the each of the electrodes 310 and 320 may be disposed in each pixel PX, electrically connected to the light emitting elements 350, and apply electrical signals to the light emitting elements such that the light emitting elements may emit light of a specific color.

Further, at least a part of the each of the electrodes 310 and 320 may be used to form an electric field in the pixel PX in order to align the light emitting elements 350. More particularly, aligning the light emitting elements 350 emitting light of different colors from each other in the plurality of pixels PX may require an accurate alignment of the light emitting elements 350 for each pixel PX. According to an exemplary embodiment, when the light emitting elements 350 are aligned using dielectrophoresis, a solution containing the light emitting elements may be applied onto the display device 10, and an AC power may be applied to the solution to form an electric field, and thus, the light emitting elements 350 may be aligned by a dielectrophoretic force.

The plurality of electrodes 310 and 320 may include a first electrode 310 and a second electrode 320. In an exemplary embodiment, the first electrode 310 may be a pixel electrode that may be individually provided for each pixel PX, and the second electrode 320 may be a common electrode connected in common along the plurality of pixels PX. Any one of the first electrode 310 and the second 320 may be an anode electrode of the light emitting element 350, and the other thereof may be a cathode electrode of the light emitting element 350, or vice versa.

The first electrode 310 and the second electrode 320 may include electrode stem portion 310S and 320S substantially extending in a first direction D1 and electrode branch portions 310B and 320B substantially extending in a second direction D2 intersecting the first direction D1 and branched from the electrode stem portions 310S and 320S, respectively.

More specifically, the first electrode 310 may include a first electrode stem portion 310S substantially extending in the first direction D1 and at least one first electrode branch portion 310B branched from the first electrode stem portion 310S and substantially extending in the second direction D2. One end of the first electrode stem portion 310S may be connected to a signal application pad, and the other end thereof may substantially extend in the first direction D1 but electrically separated between the pixels PX. The signal application pad may be connected to the display device or an external power source to apply an electrical signal to the first electrode stem portion 310S or apply an AC power thereto at the time of aligning the light emitting elements 350.

The first electrode stem portion 310S of any one pixel may be disposed on substantially the same line extending from the first electrode stem portion 310S of a neighboring pixel in the same row, such as in the first direction D1. In particular, both ends of the first electrode stem portion 310S of one pixel may be spaced apart from those of adjacent pixels PX, whereas the first electrode stem portion 310S of the neighboring pixel may be aligned along an imaginary line extending from the first electrode stem portion 310S of the one pixel PX. Such arrangement of the first electrode stem portions 310S may be obtained by, for example, forming one stem electrode during a manufacturing process, aligning the light emitting elements 350, and then disconnecting the stem electrode using a laser. Accordingly, the first electrode stem portion 310S disposed in each pixel PX may apply different electrical signals from each other to the respective pixels PX, and the respective pixels PX may be driven separately from each other.

The first electrode branch portion 310B may be branched from at least a part of the first electrode stem portion 310S and substantially extend in the second direction D2. The first electrode branch portion 310B may be spaced apart from the second electrode stem portion 320S disposed to face the first electrode stem portion 310S. In particular, one end of the first electrode branch portion 310B may be connected to the first electrode stem portion 310S, and the other end thereof may be disposed in the pixel PX while being spaced apart from the second electrode stem portion 320S. Since the first electrode branch portion 310B is connected to the first electrode branch portion 310S that may be individually provided for each pixel P, the first electrode branch portion 310B of each pixel PX may receive different electrical signals from each other.

Further, the first electrode branch portion 310B may be spaced apart from an opposing, second electrode branch portion 320B, which will be described in more detail later. FIG. 1 exemplarily shows that two first electrode branch portions 310B are spaced apart from each other and the second electrode branch portion 320B is disposed between the two first electrode branch portions 310B, however, the inventive concepts are not limited thereto, and in some exemplary embodiments, a plurality of first electrode branch portions 310B may be provided. In this case, the plurality of first electrode branch portions 310B are alternately arranged with the plurality of second electrode branch portions 320B, and a third contact electrode 363 may be disposed between the first electrode branch portion 310B and the second electrode branch portion.

The second electrode 320 may include a second electrode stem portion 320S substantially extending in the first direction D1, spaced apart from the first electrode stem portion 310S and facing the first electrode stem portion 310S, and at least one second electrode branch portion 320B branched from the second electrode stem portion 320S, substantially extending in the second direction D2, spaced apart from the first electrode branch portion 310B and facing the first electrode branch portion 310B. One end of the second electrode stem portion 320S may be connected to a signal application pad, and the other end of the second electrode stem portion 320S may extend to the plurality of pixels PX adjacent in the first direction D1. In particular, the second electrode stem portion 320S may be electrically connected between the pixels PX. Accordingly, both ends of the second electrode stem portion 320S of any one pixel may be connected to one end of the second electrode stem portion 320S of a neighboring pixel PX between the respective pixels PX, so that the same electrical signal may be applied to the respective pixels PX.

The second electrode branch portion 320B may be branched from at least a part of the second electrode stem portion 320S and substantially extend in the second direction D2. The second electrode branch portion 320B may be spaced apart from the first electrode stem portion 310S. More particularly, one end of the second electrode branch portion 320B may be connected to the second electrode stem portion 320S, and the other end thereof may be disposed in the pixel PX while being spaced apart from the first electrode stem portion 310S. Since the second electrode branch portion 320B is connected to the second electrode branch portion 320S electrically connected to each pixel P, the second electrode branch portion 320B in each pixel PX may receive the same electrical signal.

The second electrode branch portion 320B may be spaced apart from the first electrode branch portion 310B and face the first electrode branch portion 310B. Here, since the first electrode stem portion 310S and the second electrode stem portion 320S are spaced apart from each other and face each other in opposite directions with respect to the center of each pixel PX, the first electrode branch portion 310B and the second electrode branch portion 320B may substantially extend in directions opposite to each other. In particular, the first electrode branch portion 310B substantially extends in one direction of the second direction D2, and the second electrode branch portion 320B substantially extends in the other direction of the second direction D2, so that one ends of the respective branch portions may be disposed in directions opposite to each other with respect to the center of the pixel PX. However, the inventive concepts are not limited thereto, and in some exemplary embodiments, the first electrode stem portion 310S and the second electrode stem portion 320S may be spaced apart from each other in the same direction with respect to the center of the pixel PX. In this case, the first electrode branch portion 310B and the second electrode branch portion 320B, respectively branched from the first electrode stem portion 310S and the second electrode stem portion 320S, may extend substantially in the same direction.

FIG. 1 exemplarily shows that one pixel PX includes one second electrode branch portion 320B, however, the inventive concepts are not limited thereto, and a plurality of second electrode branch portions 320B may be disposed in one pixel PX.

A plurality of light emitting elements 350 may be arranged between the first electrode branch portion 310B and the second electrode branch portion 320B. The plurality of light emitting elements 350 may include at least one first light emitting element 350*a* having one end electrically connected to the first electrode branch portion 310B and at least one second light emitting element 350*b* having one end electrically connected to the second electrode branch portion 320B. The other end of the first light emitting element 350*a* and the other end of the second light emitting element 350*b* may be electrically connected to the third contact electrode 363, which will be described in more detail later.

The plurality of first light emitting elements 350*a* and the second light emitting elements 350*b* may be spaced from each other substantially in the second direction D2 and may be aligned substantially parallel to each other. Further, the plurality of first light emitting elements 350*a* may be spaced apart from the second light emitting devices 350*b* with respect to the third contact electrode 363.

An interval between the light emitting elements 350 is not particularly limited. In some exemplary embodiments, some of the plurality of light emitting elements 350 may be arranged adjacent to each other to form a group, and others of the plurality of light emitting elements 350 may be arranged to be spaced apart from each other to form another group. In other exemplary embodiments, the plurality of light emitting elements 350 may be substantially arranged and aligned in one direction with non-uniform density.

The interval between adjacent first light emitting elements 350*a* may not be constant, and an interval between adjacent second light emitting elements 350*b* may also not be constant. Accordingly, any one of the first light emitting elements 350*a* may not be aligned with any one of the second light emitting elements 350*b* in the first direction D1. In some exemplary embodiments, the second light emitting element 350*b* may be disposed to partially overlap a region where the first light emitting elements are aligned along the second direction D2.

Although FIG. 1 exemplarily shows that the light emitting elements 350 are aligned in a direction in which the first electrode branch portion 310B and the second electrode portion 320B are spaced apart from each other, and are spaced apart from each other so as not to overlap each other in the second direction D2, but the inventive concepts are not limited thereto. In some exemplary embodiments, some of the light emitting elements may partially overlap each other in a direction to which the first electrode branch portion 310B and the second electrode branch portion 320B are extended, and are spaced apart from each other so as not to be in direct contact with each other.

The plurality of first light emitting elements 350*a* may be connected to each other in parallel by electrically connecting one end of each of the first light emitting elements 350*a* to the first electrode branch portion 310B. The plurality of second light emitting elements 350*b* may be connected to each other in parallel by electrically connecting one end of each of the second light emitting elements 350*b* to the second electrode branch portion 320B. The first light emitting elements 350*a* and the second light emitting elements 350*b* may be connected in series with each other by bringing the other end of each of the first light emitting elements 350*a* and the other end of each of the second light emitting elements 350*b* into contact with the third contact electrode 363.

In this manner, even if any of the first light emitting elements 350*a* is shorted and causes another first light emitting element 350*a* connected thereto in parallel to not emit light, the second light emitting elements 350*b* connected with each other in parallel and connected to the first light emitting elements 350*a* in series may receive electrical signals. As such, even if any one of the light emitting elements 350 in the pixel PX is disconnected, the defective light emission of the pixel PX can be prevented by another light emitting element 350.

Further, when the first light emitting element 350*a* and the second light emitting element 350*b* are electrically connected to each other in series, a voltage applied to the light emitting elements 350 may be increased as compared to when the light emitting elements 350 are connected to each other in parallel, which may increase voltage distribution efficiency. Further, the amount of current required to drive the light emitting elements connected in series may be decreased, so that the capacity of a driving transistor for applying a current to the light emitting elements 350 may be decreased, and the power loss from a power supply wiring may be decreased. Accordingly, in the driving the display device 10 constructed according to the principles of the invention, voltage efficiency and/or light emitting efficiency may be improved.

At least one contact electrode 360 may be disposed in a region between the first electrode branch portion 310B and the second electrode branch portion 320B, and may be disposed on each of the electrode branch portions 310B and 320B.

A plurality of contact electrodes 360 may be arranged to substantially extend in the second direction D2, and be spaced apart from each other in the first direction D1. The contact electrodes 360 may be in contact with at least one end of each of the light emitting elements 350, and some of the contact electrodes 360 may be in contact with the first electrode 310 and the second electrode 320 to receive electrical signals. As such, the contact electrodes 360 may transmit the electrical signals received from the first electrode 310 or the second electrode 320 to the light emitting elements 350.

More specifically, the contact electrode 360 may be disposed on the electrode branch portions 310B and 320B to partially cover the electrode branch portions 310B and 320B. The contact electrode 360 may include a first contact electrode 361 and a second contact electrode 362, each contacting one end of the light emitting element 350, and a third contact electrode 363 disposed between the first electrode branch portion 310B and the second electrode branch portion 320B and contacting the other end of the light emitting element 350.

The first contact electrode 361 may be disposed on the first electrode branch portion 310B, and may be in contact with one end of the first light emitting element 350*a* electrically connected to the first electrode 310. The second contact electrode 362 may be disposed on the second electrode branch portion 320B, and may be in contact with one end of the second light emitting element 350*b* electrically connected to the second electrode 320. The third contact electrode 363 may be in contact with the other end of each of the first light emitting element 350*a* and the second light emitting element 350*b*.

In some exemplary embodiments, one end of the light emitting element 350 electrically connected to the first electrode branch portion 310B or the second electrode branch portion 320B may include a conductive material layer doped with an n-type dopant or a p-type dopant, and the other end of the light emitting element 350 contacting the third contact electrode 363 may include a conductive material layer doped with a p-type dopant or an n-type dopant, without being limited thereto.

The first contact electrode 361 and the second contact electrode 362 may be disposed on the first electrode branch 310B and the second electrode branch 320B to partially cover the first electrode branch 310B and the second electrode branch 320B, respectively. As shown in FIG. 1, the first contact electrode 361 and the second contact electrode 362 may be disposed to substantially extend along the second direction D2, spaced apart from each other to face each other. One end of each of the first contact electrode 361 and the second contact electrode 362 may expose at least a portion of one end of each of the electrode branch portions 310B and 320B, respectively. Further, the other end of each of the first contact electrode 361 and the second contact electrode 362 may be spaced apart from the electrode stem portions 310S and 320S, respectively. However, the inventive concepts are not limited thereto, and in some exemplary embodiments, the other end of each of the first contact electrode 361 and the second contact electrode 362 may cover each of the electrode branch portions 310B and 320B, respectively.

The third contact electrode 363 may be disposed between the first contact electrode 361 and the second contact electrode 362. The third contact electrode 363 may be extended and spaced apart from each of the first contact electrode 361 and the second contact electrode 362. More particularly, the third contact electrode 363 may be disposed in parallel to the first contact electrode 361 and the second contact electrode 362, and may have substantially the same shape as each of the first contact electrode 361 and the second contact electrode 362.

The third contact electrode 363 may substantially extend in the second direction D2, but both ends thereof in the second direction D2 may be spaced apart from the first electrode stem portion 310S and the second electrode stem portion 320S, respectively. In particular, the third contact electrode 363 may be electrically separated from the electrode stem portions 310S and 320S. In an exemplary embodiment, the third contact electrode 363 may be a floating electrode to which an electrical signal is not directly applied from the electrode stem portions 310S and 320S. However, the inventive concepts are not limited thereto.

The third contact electrode 363 may form a different conductive electrode layer from the first contact electrode 361 and the second contact electrode 362. For example, when a first conductive electrode layer CEL1 (see FIG. 5), in which the first electrode 310 and the second electrode 320 are disposed, a second conductive electrode layer CEL2, in which the first contact electrode 361 and the second contact electrode 362 are disposed, and a third conductive electrode layer CEL3, in which the third contact electrode 363 is disposed, are defined, the second conductive electrode layer CEL2 may be disposed on the first conductive electrode layer CEL1 and may partially be in contact with the first conductive electrode layer CELL The third conductive electrode layer CEL3 may be disposed on the second conductive electrode layer CEL2, with an insulating layer (see FIG. 5) disposed therebetween to electrically insulate the third conductive electrode layer CEL3 from the second conductive electrode layer CEL2. However, the inventive concepts are not limited thereto, and details thereof will be described later with reference to cross-sectional views.

As described above, the light emitting element 350 may be aligned between the first electrode branch 310B and the second electrode branch 320B, and both ends of the light emitting element 350 may be in contact with at least one of the contact electrodes 360. The arrangement of the first electrode branch portion 310B and the second electrode branch portion 320B, the width of the contact electrodes 360, particularly, the third contact electrode 363, and the like may be variously changed such that the light emitting element 350 may be in contact with the electrodes 310 and 320 and the contact electrode 360.

Figure 2:
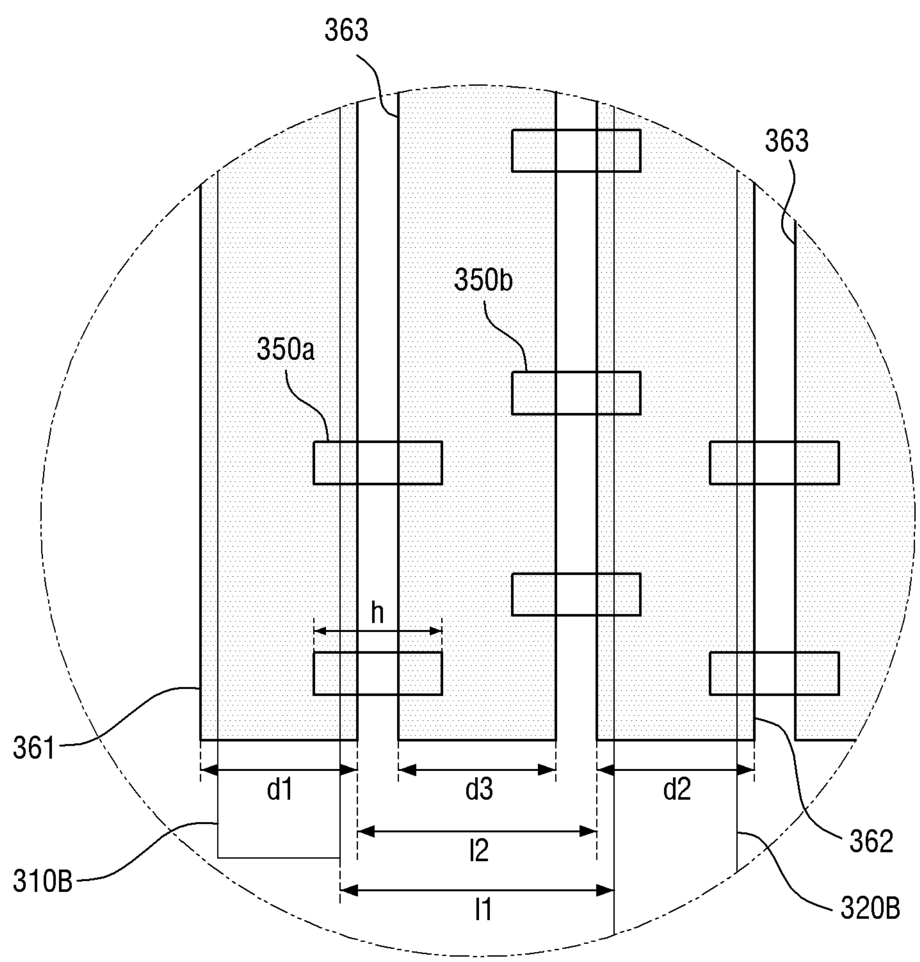
FIG. 2 is an enlarged view of portion A of FIG. 1.

FIG. 2 is an enlarged view of portion A of FIG. 1.

Referring to FIG. 2, one end of the first light emitting element 350*a* and one end of the second light emitting element 350*b* may be electrically connected to the first electrode branch portion 310B and the second electrode branch portion 320B through the first contact electrode 361 and the second contact electrode 362, respectively. The third contact electrode 363 may contact the other end of the first light emitting element 350*a* and the other end of the second light emitting element 350*b*.

The distance 11 between one side of the first electrode branch portion 310B and the opposing side of the second electrode branch portion 320B may be greater than the length h of the long axis of the light emitting element 350. The first light emitting elements 350*a* and the second light emitting elements 350*b* may be aligned substantially in the first direction D1 between the first electrode branch portion 310B and the second electrode branch portion 320B. When the first light emitting elements 350*a* and the second light emitting elements 350*b* are aligned along the same row extending in the first direction D1, the first light emitting elements 350*a* and the second light emitting elements 350*b* may be partially spaced apart from each other so as not to be in direct contact with each other.

As such, the distance 11 between the opposing sides of the first electrode branch portion 310B and the second electrode branch portion 320B may be greater than the length h of the long axis of the light emitting element 350. For example, the distance 11 may be about 1 time to about 2 times of the length h of the long axis of the light emitting element 350. For example, the length h of the long axis of the light emitting element 350 may be about 3.0 μm to about 6.0 μm, and the distance 11 between the opposing sides of the first electrode branch portion 310B and the second electrode branch portion 320B may be about 6.0 μm to about 12.0 μm. However, the inventive concepts are not limited thereto.

The width d1 of the first contact electrode 361 and a width d2 of the second contact electrode 362 may each be wider than the widths of the corresponding electrode branches 310B and 320B. As such, even if one end of the light emitting element 350 is not directly connected to the first electrode branch portion 310B or the second electrode branch portion 320B, it may be electrically connected to the first electrode branch portion 310B or the second electrode branch portion 320B through the contact electrode 360. The third contact electrode 363 may have a predetermined width in contact with both one end of the first light emitting element 350*a* and opposing end of the second light emitting element 350*b*.

The width d3 of the third contact electrode 363 may be greater than the length h of the long axis of the light emitting element 350, but may be less than a distance 12 between one side of the first contact electrode 361 and the opposing side of the second contact electrode 362. When the width d3 of the third contact electrode 363 is too narrow, the third contact electrode 363 may not be in contact with the end of any one light emitting element 350 when the first light emitting element 350*a* and the second light emitting element 350*b* are spaced apart from each other. In contrast, when the width d3 of the third contact electrode 363 is too wide, the third contact electrode 363 may be in direct contact with the first contact electrode 361 or the second contact electrode 362. As such, the width d3 of the third contact electrode 363 may be greater than the length h of the long axis of the light emitting element 350, but shorter than the distance 12 between the opposing sides of the first contact electrode 361 and the second contact electrode 362.

However, in some exemplary embodiments, the width d3 of the third contact electrode 363 may be greater than the distance 12 between the opposing sides of the first contact electrode 361 and the second contact electrode 362. Referring to a cross-sectional view of the display device 10 to be described later, the first contact electrode 361 and the second contact electrode 362 may form a second conductive electrode layer CEL2, and the third contact electrode 363 may form a third conductive electrode layer CEL3. Here, the second conductive electrode layer CEL2 and the third conductive electrode layer CEL3 may be disposed on different layers with the third insulating layer 530 interposed therebetween. In this case, at least a part of the third contact electrode 363 may overlap the first contact electrode 361 and the second contact electrode 362 in a cross-sectional view.

Referring back to FIG. 1, the first electrode stem portion 310S and the second electrode stem portion 320S may be electrically connected to the thin film transistor 120 (see FIG. 5) or the power supply wiring 161 to be described later through contact holes, for example, a first contact hole CNTD and a second contact hole CNTS, respectively. FIG. 1 exemplarily shows that the contact holes on the first electrode stem portion 310S and the second electrode stem portion 320S are disposed for each pixel PX, but the inventive concepts are not limited thereto. As described above, since the second electrode stem portion 320S may extend to be electrically connected to an adjacent pixel PX, in some exemplary embodiments, the second electrode stem portion 320S may be electrically connected to a thin film transistor through one contact hole.

Figure 3:
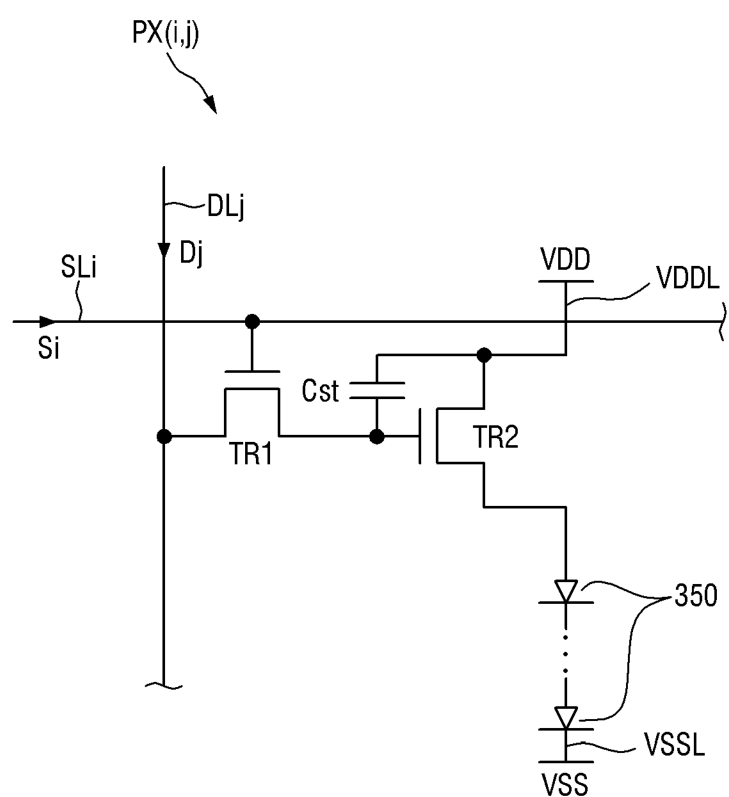
FIG. 3 is an equivalent circuit diagram of one representative pixel of the display device of FIG. 1 according to an exemplary embodiment.

FIG. 3 is an equivalent circuit diagram of one representative pixel of the display device of FIG. 1 according to an exemplary embodiment. FIG. 3 exemplarily shows an ith and jth pixel PX(i,j) among a plurality of pixels PX in the display device 10.

Referring to FIG. 3, the ith and jth pixel PX(i,j) of the display device 10 may include an ith scan line SLi, a jth data line DLj, a first switching element TR1, a second switching element TR2, and a light emitting element 350, and a storage capacitor Cst.

The first switching element TR1 may be electrically connected to the ith scan line SLi, the jth data line DLj, and the second switching element TR2. In an exemplary embodiment, the first switching element TR1 and the second switching element TR2 may be three terminal elements, such as thin film transistors. Hereinafter, the first switching element TR1 and the second switching element TR2 will be described with reference to thin film transistors.

The first switching element TR1 may include a control electrode electrically connected to the ith scan line SLi, a first electrode electrically connected to the jth data line DLj, and a second electrode electrically connected to a control electrode of the second switching element TR2.

The second switching element TR2 may include a control electrode electrically connected to the second electrode of the first switching element TR1, a first electrode electrically connected to a first driving voltage line VDDL to which a first driving voltage VDD is provided, and a second electrode electrically connected to the light emitting element 350.

The storage capacitor Cst may include a first electrode electrically connected to the second electrode of the first switching element TR1, and a second electrode electrically connected to the first driving voltage line VDDL to which the first driving voltage VDD is provided.

The first switching element TR1 may be turned on according to a scan signal Si received from the ith scan line SLi, and may supply a data signal Dj received from the jth data line DLj to the storage capacitor Cst. The storage capacitor Cst may charge a voltage difference between a voltage of the received data signal Dj and a first driving voltage VDD. The second switching device TR2 may control the amount of driving current supplied to the light emitting element 350 according to the voltage charged in the storage capacitor Cst. In particular, the first switching element TR1 may be a switching transistor, and the second switching element TR2 may be a driving transistor.

One end of the light emitting element 350 connected to the first electrode 310 may be electrically connected to the second electrode of the second switching element TR2. The light emitting element 350 may receive current through the second electrode of the second switching element TR2. The other end of the light emitting element 350 connected to the second electrode 320 may be electrically connected to a second driving voltage line VSSL. As such, the light emitting element 350 may receive a second driving voltage VSS. The first driving voltage VDD may have a higher voltage level than the second driving voltage VSS.

As shown in FIG. 3, the plurality of light emitting elements 350 may be connected in series between the second switching element TR2 and the second driving voltage line VSSL to which second driving voltage VSS is provided. As shown in the drawing, the inventive concepts are not limited to a particular number of the light emitting elements connected in series. In this manner, the voltage distribution efficiency between the light emitting elements 350 and the first driving voltage VDD and second driving voltage VSS necessary for driving the respective light emitting elements 350 can be improved. Since the current flowing through the second switching element TR2 decreases as the light emitting elements 350 are connected in series, determining the capacity of the thin film transistor may become easier. Further, since the current flowing through the second switching element TR2 is decreased, the power loss in the power supply line or the power loss in the first driving voltage line VDDL and the second driving voltage line VSSL may be reduced.

Although FIG. 3 exemplarily illustrates that the display device 10 includes two switching elements, that is, the first switching element TR1 and the second switching element TR2, and one capacitor, that is, the storage capacitor Cst, the inventive concepts are not limited thereto. For example, in some exemplary embodiments, the display device 10 may include a greater number of switching elements. Hereinafter, an equivalent circuit diagram of a display device according to another exemplary embodiment will be described with reference to FIG. 4.

Figure 4:
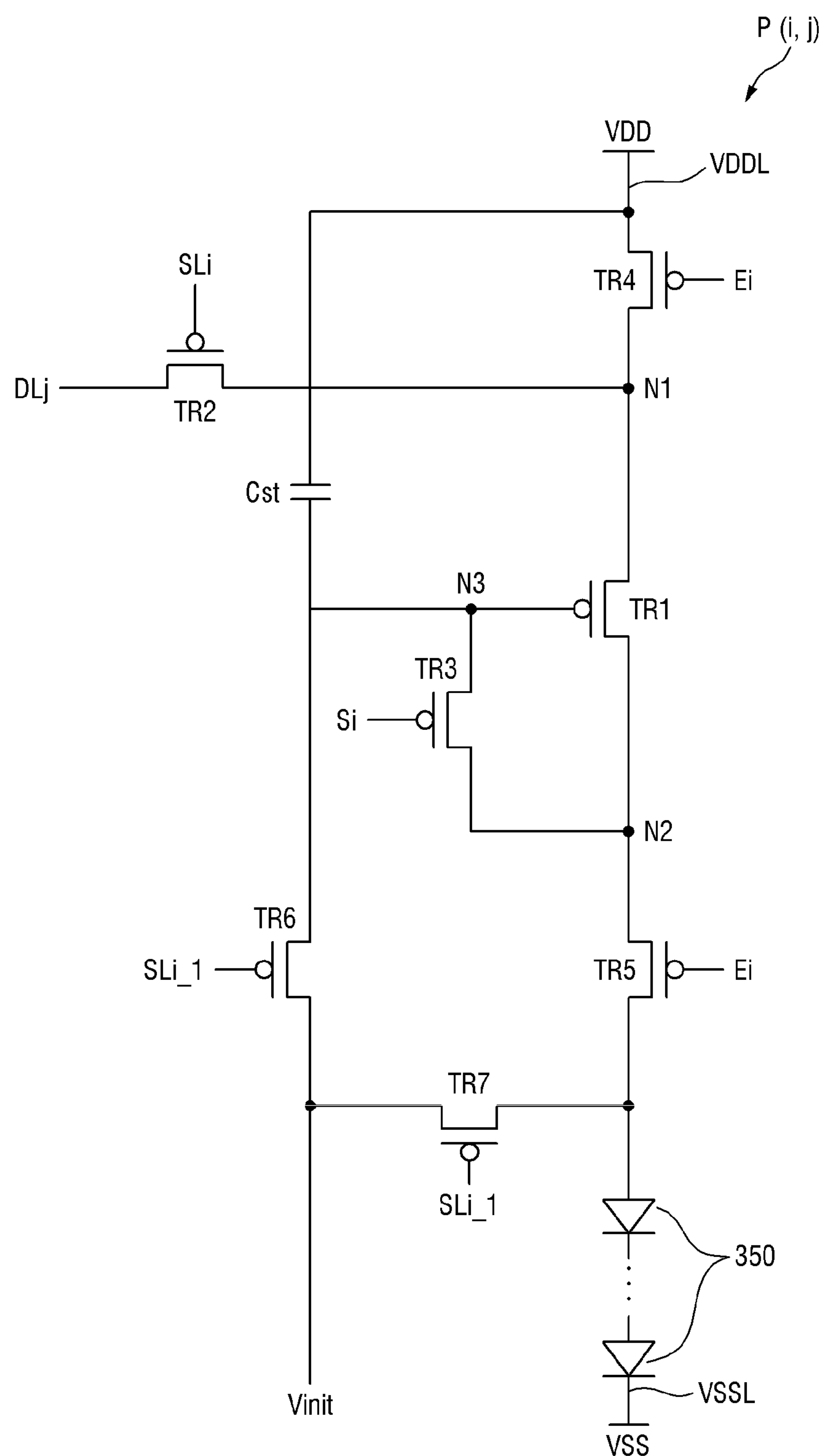
FIG. 4 is an equivalent circuit diagram of one representative pixel of a display device according to another exemplary embodiment.

FIG. 4 is an equivalent circuit diagram of one representative pixel of a display device according to another exemplary embodiment. FIG. 4 exemplarily shows an ith and jth pixel PX(i,j).

Referring to FIG. 4, the ith and jth pixel PX(i,j) of the display device 10 may include an ith scan line SLi, an i−1th scan line SLi−1, a jth data line DLj, an ith light emission control line Ei, first to seventh switching elements TR1 to TR7, a light emitting element 350, and a storage capacitor Cst.

One end of the light emitting element 350 connected to the first electrode 310 may be electrically connected to one electrode of the fifth switching element TR5 and one electrode of the seventh switching element TR7. The light emitting element 350 may receive current through the one electrode of the fifth switching element TR5 and the one electrode of the seventh switching element TR7. The other end of the light emitting element 350 connected to the second electrode 320 may be electrically connected to a second driving voltage line VSSL to receive a second driving voltage VSS.

One electrode of the first switching element TR1 is electrically connected to a first node N1, and the other electrode of the first switching element TR1 is electrically connected to a second node N2. The gate electrode of the first switching element TR1 is electrically connected to one end of the storage capacitor Cst through a third node N3. The first switching element TR1 is electrically connected to one end of the light emitting element 350 via the fifth switching element TR5. The first switching element TR1 may receive a data signal of the jth data line DLj according to the switching operation of the second switching element TR2 and supply current to the light emitting element 350.

One electrode of the second switching element TR2 is electrically connected to the jth data line DLj, and the other electrode of the second switching element TR2 is electrically connected to the first node N1. The gate electrode of the second switching element TR2 is electrically connected to the ith scan line SLi. The other electrode of the second switching element TR2 electrically connected to the first node N1 is electrically connected to the first driving voltage line VDDL through the fourth switching element TR4. The first switching element TR1 may be turned on by a scan signal of the ith scan line SLi to transfer the data signal transferred to the jth data line DLj to the first switching element TR1.

One electrode of the third switching element TR3 is electrically connected to the second node N2, and the other electrode of the third switching element TR3 is electrically connected to the third node N3. The gate electrode of the third switching element TR3 is electrically connected to the ith scan line SLi. When the scan signal is applied to the ith scan line SLi, the third switching element TR3 is turned on to be diode-connected with the first switching element TR1.

One electrode of the fourth switching element TR4 is electrically connected to the first driving voltage line VDDL to be supplied with the first driving voltage VDD. The other electrode of the fourth switching element TR4 is electrically connected to the first node N1, and the gate electrode of the fourth switching element TR4 is electrically connected to the ith light emission control line Ei.

One electrode of the fifth switching element TR5 is electrically connected to the second node N2, and the other electrode of the fifth switching element TR5 is electrically connected to the one end of the light emitting element 350. The gate electrode of the fifth switching element TR5 is electrically connected to the ith light emission control line Ei. The fourth switching element TR4 and the fifth switching element TR5 are simultaneously turned on in response to the light emission control signal received through the ith light emission control line Ei, and thus, the first driving voltage VDD is transferred to the light emitting element 350 as driving current.

One electrode of the sixth switching element TR6 is electrically connected to the third node N3, and the other electrode of the sixth switching element TR6 is supplied with an initialization power Vinit. The gate electrode of the sixth switching element TR6 is electrically connected to the i−1th scan line SLi−1. When scan signals are sequentially supplied to the scan lines SL, the scan signal may be supplied to the ith scan line SLi after the scan signal is supplied to the i−1th scan line SLi−1. The sixth switching element TR6 is turned on in response to the scan signal transferred through the i−1th scan line SLi−1 to transfer the initialization power Vinit to the gate electrode of the first switching element TR1, so as to initialize the voltage of the gate electrode of the first switching element TR1.

One electrode of the seventh switching element TR7 is electrically connected to the one end of the light emitting element 350, and the other electrode of the seventh switching element TR7 is supplied with the initialization power Vinit. The gate electrode of the seventh switching element TR7 is electrically connected to the i−1th scan line SLi−1. The seventh switching element TR7 may be turned on in response to the scan signal to initialize one end electrode of the light emitting element 350.

The first to seventh switching elements TR1 to TR7 may be thin film transistors. In each of the first to seventh switching elements TR1 to TR7, one end thereof may be any one of a source electrode and a drain electrode, and the other end may be the other one of a source electrode and a drain electrode.

One end of the storage capacitor Cst may be electrically connected to the first driving voltage line VDDL to be supplied with the first driving voltage VDD, and the other end thereof may be electrically connected to the third node N3.

Hereinafter, more specific structures of a plurality of members disposed on the display device 10 will be described with reference to FIG. 5.

Figure 5:
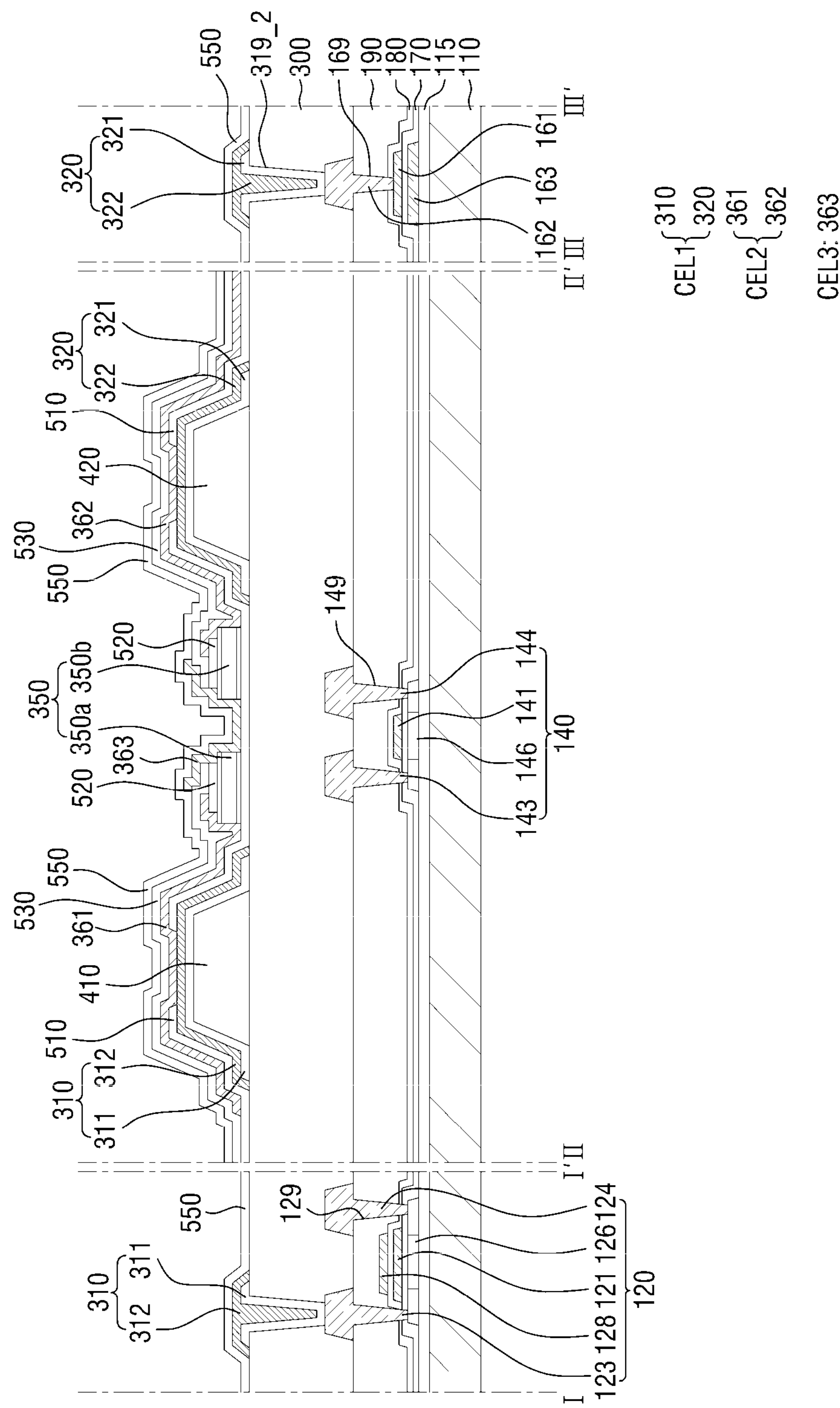
FIG. 5 is a cross-sectional view taken along lines I-I', and of FIG. 1.

FIG. 5 is a cross-sectional view taken along lines I-I', and of FIG. 1. Although FIG. 5 exemplarily shows a cross-section of only one pixel PX, other pixels PX may have substantially the same structure. FIG. 5 shows a cross-section across one end and the other end of one light emitting element 350.

Referring to FIGS. 1 to 5, the display device 10 may include a substrate 110, thin film transistors 120 and 140 disposed on the substrate 110, electrodes 310 and 320 disposed on the thin film transistors 120 and 140. The thin film transistors may include a first thin film transistor 120 and a second thin film transistor 140, which may be a driving transistor and a switching transistor, respectively. Each of the thin film transistors 120 and 140 may include an active layer, a gate electrode, a source electrode, and a drain electrode. The first electrode 310 may be electrically connected to the drain electrode of the first thin film transistor 120.

The substrate 110 may be an insulating substrate. The substrate 110 may be made of an insulating material, such as glass, quartz, or a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The substrate 110 may be a rigid substrate, but in some exemplary embodiments, the substrate 110 may be a flexible substrate capable of bending, folding, rolling, or the like.

A buffer layer 115 may be disposed on the substrate 110. The buffer layer 115 may prevent the diffusion of impurity ions and the penetration of moisture or external air, and may provide a planar surface. The buffer layer 115 may include silicon nitride, silicon oxide, or silicon oxynitride.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, or the like.

A first gate insulating layer 170 is disposed on the semiconductor layer. The first gate insulating layer 170 covers the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like. These compounds may be used alone or in combination with each other.

A first conductive layer is disposed on the first gate insulating layer 170. The first conductive layer may include a first gate electrode disposed on the first active layer 126 of the first thin film transistor 120, a second gate electrode disposed on the second active layer 146 of the second thin film transistor 140, and a power supply wiring 161 disposed on the auxiliary layer 163, with the first gate insulating layer 170 therebetween. The first conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may have a single-layer or a multilayer structure.

A second gate insulating layer 180 is disposed on the first conductive layer. The second gate insulating layer 180 may be an interlayer insulating film. The second gate insulating layer 180 may include an inorganic insulating material, such as silicon oxide, silicon nitride, silicon oxynitride, hafnium oxide, aluminum oxide, titanium oxide, tantalum oxide, or zinc oxide.

A second conductive layer is disposed on the second gate insulating layer 180. The second conductive layer includes a capacitor electrode 128 disposed on the first gate electrode 121 with the second gate insulating layer 180 therebetween.

The capacitor electrode 128 may form a storage capacitor together with the first gate electrode 121.

The second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An interlayer insulating layer 190 is disposed on the second conductive layer. The interlayer insulating layer 190 may be an interlayer insulating film. Moreover, the interlayer insulating layer 190 may provide a planar surface. The interlayer insulating layer 190 may include an organic insulating material such as polyacrylate resin, epoxy resin, phenolic resin, polyamide resin, polyimide rein, unsaturated polyester resin, polyphenyleneether resin, polyphenylenesulfide resin, or benzocyclobutene (BCB).

A third conductive layer is disposed on the interlayer insulating layer 190. The third conductive layer includes a first drain electrode 123 and a first source electrode 124 of the first thin film transistor 120, a second drain electrode 143 and a second source electrode 144 of the second thin film transistor 140, and a power supply electrode 162 disposed on the power supply wiring 161.

Each of the first source electrode 124 and the first drain electrode 123 may be electrically connected to the first active layer 126 through a first contact hole 129 penetrating the interlayer insulating layer 190 and the second gate insulating layer 180. Each of the second source electrode 144 and the second drain electrode 143 may be electrically connected to the second active layer 146 through a second contact hole 149 penetrating the interlayer insulating layer 190 and the second gate insulating layer 180. The power supply electrode 162 may be electrically connected to the power supply wiring 161 through a third contact hole 169 penetrating the interlayer insulating layer 190 and the second gate insulating layer 180.

The third conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may have a single-layer or a multilayer structure. For example, the third conductive layer may have a laminate structure of Ti/Al/Ti, Mo/Al/Mo, Mo/AlGe/Mo, or Ti/Cu.

An insulating substrate layer 300 is disposed on the third conductive layer. The insulating substrate layer 300 may include an organic insulating material, such as polyacrylate resin, epoxy resin, phenolic resin, polyamide resin, polyimide rein, unsaturated polyester resin, polyphenyleneether resin, polyphenylenesulfide resin, or benzocyclobutene (BCB). The surface of the insulating substrate layer 300 may be flat.

A plurality of partition walls 410 and 420 may be disposed on the insulating substrate layer 300. The plurality of partition walls 410 and 420 are spaced apart from each other and face each other in each of the pixels PX. The first electrode 310 and the second electrode 320 may be disposed on the partition walls 410 and 420 spaced apart from each other, for example, a first partition wall 410 and a second partition wall 420. Referring to FIGS. 1 and 5, FIG. 1 exemplarily shows each pixel PX includes three partition walls, more specifically, two first partition walls 410 and one second partition wall 420, and thus, two first electrodes 310 and one second electrode 320 are disposed thereon. FIG. 5 exemplarily shows a cross-sectional view of one first partition wall 410 and one second partition wall 420, and the arrangement structure thereof may be equally applied to other first partition walls 410 not shown in FIG. 5.

However, the inventive concepts are not limited thereto, and a greater number of partition walls 410 and 420 may be disposed in one pixel PX. For example, a greater number of partition walls 410 and 420 may be disposed in one pixel PX, and thus, a greater number of first and second electrodes 210 and 220 may be disposed. The partition walls 410 and 420 may include at least one first partition wall 410 on which the first electrode 210 is disposed, and at least one second partition wall 420 on which the second electrode 220 is disposed. In this case, the first partition 410 and the second partition wall 420 may be spaced apart from and opposing each other, and the plurality of partition walls may be alternately arranged in one direction. In some exemplary embodiments, two first partition walls 410 may be spaced apart from each other, and one second partition wall 420 may be disposed therebetween.

The first electrode 310 and the second electrode 320 may include the electrode stem portions 310S and 320S and the electrode branch portions 310B and 320B, respectively, which may be disposed on the first partition wall 410 and the second partition wall 420, respectively.

The plurality of partition walls 410 and 420 may be made of substantially the same material, and thus, may be formed in one process. In this case, the partition walls 410 and 420 may form one lattice pattern. The partition walls 410 and 420 may include polyimide (PI).

At least some of the plurality of partition walls 410 and 420 may be disposed at the boundary between the respective pixels PX to distinguish the pixels PX from each other. These partition walls may be arranged in a substantially lattice pattern together with the first partition wall 410 and second partition wall 420 described above. At least some of the plurality of partition walls 410 and 420 disposed at the boundary between the respective pixels PX may be disposed to cover the electrode lines of the display panel 10.

Each of the plurality of partition walls 410 and 420 may have a structure in which at least a part thereof protrudes from the insulating substrate layer 300. Each of the partition walls 410 and 420 may protrude upwardly with respect to a plane on which the light emitting element 350 is disposed, and at least a part of the protruding portion may have an inclination. Each of the partition walls 410 and 420 protruding with an inclination may reflect light incident on reflective layers 311 and 321 disposed thereon, which will be described later. Light emitted from the light emitting element 350 towards the reflective layers 311 and 321 may be reflected and transmitted to the outside of the display device 10, for example, above the partition walls 410 and 420. FIG. 5 exemplarily shows that each of the partition walls 410 and 42 has a protruding structure having an angled corner shape, in which both side surfaces are flat and one upper side is flat, however, the inventive concepts are not limited to a particular shape of the partition walls 410 and 420. For example, in some exemplary embodiments, each of the partition walls 410 and 42 may have a structure protruding in a curved shape.

The reflective layers 311 and 321 may be disposed on the plurality of partition walls 410 and 420.

The first reflective layer 311 covers the first partition wall 410, and a part thereof is electrically connected to the first drain electrode 123 of the first thin film transistor 120 through a fourth contact hole 319_1 penetrating the insulating substrate layer 300. The second reflective layer 321 covers the second partition wall 420, and a part thereof is electrically connected to the power supply electrode 162 through a fifth contact hole 319_2 penetrating the insulating substrate layer 300.

The first reflective layer 311 may be electrically connected to the first drain electrode 123 of the first thin film transistor 120 through the fourth contact hole 319_1 in the pixel PX. As such, the first thin film transistor 120 may be disposed in a region overlapping the pixel PX. The first reflective layer 311 is electrically connected to the first thin film transistor 120 through the first electrode contact hole CNTD disposed on the first electrode stem portion 310S, as shown in FIG. 1. The first electrode contact hole CNTD may be the fourth contact hole 319_1.

The second reflective layer 321 may be electrically connected to the power supply electrode 162 through the fifth contact hole 319_2 in the pixel PX. As shown in FIG. 5, the second reflective layer 321 is electrically connected to the power supply electrode 162 through the fifth contact hole 319_2 in one pixel PX. The second electrode 320 of each pixel PX is electrically connected to the power supply wiring 161 through the plurality of second electrode contact holes CNTS on the second electrode stem portion 320S, as shown in FIG. 1. The second electrode contact hole CNTD may be the fifth contact hole 319_2.

As described above, in FIG. 1, the first electrode contact hole CNTD and the second electrode contact hole CNTS are disposed on the first electrode stem portion 310S and the second electrode stem portion 320S, respectively. Accordingly, in the cross-sectional view of the display device 10 as shown in FIG. 5, the first electrode 310 and the second electrode 320 are electrically connected to the first thin film transistor 120 or the power supply wiring 161 through the fourth contact hole 319_1 and the fifth contact hole 319_2, respectively, in a region spaced apart from the partition walls 410 and 420 where the first electrode branch portion 310B and the second electrode branch portion 320B are disposed.

However, the inventive concepts are not limited thereto. For example, referring back to FIG. 1, the second electrode contact hole CNTS may be disposed at various other positions of the second electrode stem portion 320S, and in some exemplary embodiments, the second electrode contact hole CNTS may be disposed on the second electrode branch portion 320B. Further, in some exemplary embodiments, the second reflective layer 321 may be connected to one second electrode contact hole CNTS or one fifth contact hole 319_2 in a region other than the pixel PX.

The display device 10 may include an area other than the light-emitting area where the light emitting elements 350 are disposed, for example, a non-light emitting area where the light emitting elements 350 are not disposed. As described above, the second electrodes 320 of each pixel PX are electrically connected to each other through the second electrode stem portion 320S, so as to receive the same electrical signal.

In some exemplary embodiments, in the case of the second electrode 320, the second electrode stem portion 320S may be electrically connected to the power supply electrode 162 through one second electrode contact hole CNTS formed in the non-light emitting area located at the outside of the display device 10. Unlike the display device 10 shown in FIG. 1, even when the second electrode stem portion 320S is connected to the power supply electrode 162 through one contact hole, since the second electrode stem portion 320S is extended to the adjacent pixel PX and is electrically connected, the same electric signal may be applied to the second electrode branch portion 320B of each pixel PX. In the case of the second electrode 320 of the display device 10, the position of the contact hole for receiving an electric signal from the power supply electrode 162 may be varied according to the structure of the display device 10.

Referring back to FIGS. 1 and 5, each of the reflective layers 311 and 321 may include a high-reflectance material to reflect light emitted from the light emitting element 350. For example, each of the reflective layers 311 and 321 may include a material, such as silver (Ag) or copper (Cu), but the inventive concepts are not limited thereto.

A first electrode layer 312 and a second electrode layer 322 may be disposed on the first reflective layer 311 and the second reflective layer 321, respectively.

The first electrode layer 312 may be directly disposed on the first reflective layer 311. The first electrode layer 312 may have substantially the same pattern as the first reflective layer 311. The second electrode layer 322 may be directly disposed on the second reflective layer 321 and spaced apart from the first electrode layer 312. The second electrode layer 322 may have substantially the same pattern as the second reflective layer 321.

In an exemplary embodiment, the electrode layers 312 and 322 may cover the underlying reflective layers 311 and 321, respectively. More particularly, the electrode layers 312 and 322 may be formed to be larger than the reflective layers 311 and 321 to cover the side surfaces of ends of the electrode layers 312 and 322. However, the inventive concepts are not limited thereto.

The first electrode layer 312 and the second electrode layer 322 may transmit electric signals transmitted to the first reflective layer 311 and second reflective layer 321 connected to the first thin film transistor 120 or the power supply electrode 162 to contact electrodes to be described later. The electrode layers 312 and 322 may include a transparent conductive material. For example, the electrode layers 312 and 322 may include a material, such as indium tin oxide (ITO), indium zinc oxide (IZO), or indium tin-zinc oxide (ITZO), but the inventive concepts are not limited thereto. In some exemplary embodiments, the reflective layers 311 and 321 and the electrode layers 312 and 322 may have a structure in which a transparent conductive layer, such as ITO, IZO, or ITZO, and a metal layer, such as silver or copper, are laminated one over the other. For example, the reflective layers 311 and 321 and the electrode layers 312 and 322 may have a laminate structure of ITO/silver (Ag)/ITO.

The first reflective layer 311 and the first electrode layer 312, which are disposed on the first partition wall 410, may form the first electrode 310. The first electrode 310 may protrude to a region extending from both ends of the first partition wall 410, and thus, the first electrode 310 may be in contact with the insulating substrate layer 300 in the protruding region. The second reflective layer 321 and the second electrode layer 322, which are disposed on the second partition wall 420, may form the second electrode 320. The second electrode 320 may protrude to a region extending from both ends of the second partition wall 420, and thus, the second electrode 320 may be in contact with the insulating substrate layer 300 in the protruding region.

The respective reflective layers 311 and 321 and respective electrode layers 312 and 322 of the first electrode 310 and the second electrode 320 may form the first conductive electrode layer CEL1 as described above.

The first electrode 310 and the second electrode 320 may be disposed to cover substantially the entire region of the first partition wall 410 and substantially the entire region of the second partition wall 420, respectively. However, as described above, the first electrode 310 and the second electrode 320 are spaced apart from and opposing each other. As will be described later, a first insulating layer 510 may be disposed between the first electrode 310 and second electrode 320 spaced apart from each other, and the light emitting element 350 may be disposed on the first insulating layer 510.

Further, the first reflective layer 311 may receive a driving voltage from the first thin film transistor 120, and the second reflective layer 321 may receive a power supply voltage from the power supply wiring 161, so that the first electrode 310 and the second electrode 320 receive a driving voltage and a power supply voltage, respectively. The first electrode 310 may be electrically connected to the first thin film transistor 120, and the second electrode 320 may be electrically connected to the power supply wiring 161. Accordingly, the first contact electrode 361 and the second contact electrode 362 disposed on the first electrode 310 and the second electrode 320 may receive the driving voltage and the power supply voltage. The driving voltage and the power supply voltage are transmitted to the light emitting element 350 through the third contact electrode 363 disposed between the first electrode 310 and the second electrode 320, and a predetermined current flows through the light emitting element 350 to emit light.

The first insulating layer 510 is disposed on the first electrode 310 and the second electrode 320 to partially cover them. The first insulating layer 510 may cover most of the upper surfaces of the first electrode 310 and the second electrode 320, and may expose a part of the first electrode 310 and a part of the second electrode 320. The first insulating layer 510 may be disposed in a space between the first electrode 310 and second electrode 320. The first insulating layer 510 may have an island shape or a linear shape formed along a space between the first electrode branch portion 310B and the second electrode branch portion 320B in a plan view.

FIG. 5 exemplarily shows that the first insulating layer 510 is disposed in a space between one first electrode 310 (for example, the first electrode branch portion 310B) and one second electrode 320 (for example, the second electrode branch portion 320B). However, as described above, since the first electrodes 310 may be provided in plural and the second electrodes 320 may be provided plural, the first insulating layer 510 may be also disposed between one first electrode 310 and another second electrode 320 or between one second electrode 320 and another second electrode 320. Further, the first insulating layer 510 may be disposed on sides opposite to the facing sides of the first electrode 310 and the second electrode 320 so as to partially cover them. More particularly, the first insulating layer 510 may expose the centers of the first electrode 310 and the second electrode 320.

The light emitting element 350 is disposed on the first insulating layer 510. The first insulating layer 510 may be disposed between the light emitting element 350 and the insulating substrate layer 300. The lower surface of the first insulating layer 510 may be in contact with the insulating substrate layer 300, and the light emitting element 350 may be disposed on the upper surface of the first insulating layer 510. Further, both side surfaces of the first insulating layer 510 may be in contact with the first electrode 310 and the second electrode 320 to electrically insulate them from each other.

The first insulating layer 510 may partially overlap each of the electrodes 310 and 320, for example, a part of a region protruding in a direction in which the first electrode 310 and the second electrode 320 face each other. The first insulating layer 510 may also be disposed in a region where the inclined side surface and flat upper surfaces of each of the partition walls 410 and 420 overlap each of the electrodes 310 and 320.

For example, the first insulating layer 510 may cover each end protruding in a direction in which the first electrode 310 and the second electrode 320 face each other. The first insulating layer 501 may be in contact with a part of the lower surface of the insulating substrate layer 300, and may be in contact with the side surface of each of the electrodes 310 and 320, and a part of the lower surface of each of the electrodes 310 and 320. In this manner, the first insulating layer 510 may protect the region overlapping each of the electrodes 310 and 320, and electrically insulate them from each other. Further, the first insulating layer 510 may prevent the first conductive semiconductor layer 351 and second conductive semiconductor layer 352 (see FIG. 6) of the light emitting element 350 from being in direct contact with other substrates to prevent damage to the light emitting element 350.

However, the inventive concepts are not limited thereto, and the first insulating layer 510 may be disposed only in the region overlapping the inclined surfaces of the partition walls 410 and 420 among the regions on the first electrode 310 and the second electrode 320. In this case, the lower portion of the first insulating layer 510 ends at the inclined surface of each of the partition walls 410 and 420, and each of the electrodes 310 and 320 disposed on a part of the inclined surface of each of the partition walls 410 and 420 is exposed to be in contact with the contact electrode 360.

Further, the first insulating layer 510 may be disposed such that both ends of the light emitting device 350 are exposed. Accordingly, the contact electrode 360 may be in contact with the exposed upper surface of each of the electrodes 310 and 320 and both ends of the light emitting element 350, and the contact electrode 360 may transmit an electrical signal applied to the first electrode 310 and the second electrode 320 to the light emitting element 350.

At least one light emitting element 350 may be disposed between the first electrode 310 and the second electrode 320. FIG. 5 exemplarily shows that two light emitting elements 350 are disposed between the first electrode 310 and the second electrode 320 in a cross-section, however, the inventive concepts are not limited thereto, and the plurality of light emitting elements 350 may be arranged in a different direction (for example, second direction D2) on a plane, as shown in FIG. 1.

More specifically, the plurality of light emitting elements 350 may include at least one first light emitting element 350*a* having one end electrically connected to the first electrode 310 and at least one second light emitting element 350*b* having one end electrically connected to the second electrode 320. One end of the first light emitting element 350*a* may be connected to the first electrode 310, and the other end thereof may be in contact with the third contact electrode 363. One end of the second light emitting element 350*b* may be connected to the second electrode 320, and the other end thereof may be in contact with the third contact electrode 363. As described above, the first light emitting element 350*a* and the second light emitting element 350*b* may be connected in series to each other.

The plurality of first light emitting elements 350*a* may be connected in parallel to each other, and the plurality of second light emitting elements 350*b* may be connected in parallel to each other, while the first light emitting element 350*a* and the second light emitting element 350*b* may be connected in series to each other. In this manner, even if any one of the first light emitting elements 350*a* is shorted, and thus, other first light emitting elements 350*a* do not emit light, the plurality of second light emitting elements 350*b* connected in series to the first light emitting elements 350*a*, and connected in parallel between the second light emitting elements 350*b* may simultaneously emit light. As such, the plurality of light emitting elements 350 in one pixel PX are connected in series or in parallel to each other, so that it is possible to prevent defective pixels PX even if any one of the light emitting elements 350 is shorted.

Meanwhile, although FIG. 1 illustrates that only the light emitting elements 350 emitting light of the same color are arranged in each pixel PX, the inventive concepts are not limited thereto. As described above, in some exemplary embodiments, the light emitting elements 350 emitting light of different colors from each other may be arrange in one pixel PX.

As described above, the distance between the first electrode 310 and the second electrode 320 is longer than the length h of the long axis of the light emitting element 350. For example, the distance between the first and second electrodes 310 and 320 may be about two times or less of the length h thereof. As such, the third contact electrode 363 between the first electrode 310 and the second electrode 320 may easily make electrical contact with the light emitting element 350.

The light emitting element 350 may include a light emitting diode. The light emitting element 350 may have a nanostructure, whose size is generally in nanometers. The light emitting element 350 may be an inorganic light emitting diode including an inorganic material. When the light emitting element 350 is an inorganic light emitting diode, and when a light emitting material having an inorganic crystal structure is disposed between two electrodes facing each other and an electric field is formed in the light emitting material in a specific direction, the inorganic light emitting diode may be aligned between the two electrodes formed with a specific polarity.

In some exemplary embodiments, the light emitting element 350 may have a structure in which a first conductive semiconductor layer 351, an active material layer 353, a second conductive semiconductor layer 352, and a second electrode material layer 357 are laminated. The first conductive semiconductor layer 351, the active material layer 353, the second conductive semiconductor layer 352, and the second electrode material layer 357 may be sequentially arranged in a direction horizontal to the insulating substrate layer 300. In particular, the light emitting element 350, in which the plurality of layers are laminated, may be disposed in a horizontal direction with respect to the insulating substrate layer 300. However, the inventive concepts are not limited thereto, and in some exemplary embodiments, the light emitting element 350 may have a reversed stacked sequence from that described above between the first electrode 310 and the second electrode 320.

The second insulating layer 520 may be disposed to overlap at least a part of the region on the light emitting device 350. The second insulating layer 520 may protect the light emitting element 350, and may fix the light emitting element 350 between the first electrode 310 and the second electrode 320.

Although FIG. 5 shows that the second insulating layer 520 is disposed only on the upper surface of the light emitting element 350 in a cross-sectional view, in some exemplary embodiments, the second insulating layer 520 may surround the outer surface of the light emitting element 350. In particular, as in the first insulating layer 510, the second insulating layer 520 may extend in the second direction D2 along a space between the first electrode branch portion 310B and the second electrode branch portion 320B, so as to have an island-type shape or a linear shape in a plan view.

Further, a part of the second insulating layer 520 may be disposed in a region where the lower surface of the light emitting element 350 is in contact with the first insulating 510. This configuration may be formed when the light emitting element 350 is aligned on the first insulating layer 510 and the second insulating layer 520 is disposed on the first insulating layer 510 at the time of manufacturing the display device 10. When voids are formed in the first insulation layer 510 contacting the lower surface of the light emitting element 350, a part of the material of the second insulating layer 520 may penetrate into the voids when the second insulating layer 520 is formed, so as to form the configuration.

The second insulating layer 520 is disposed to expose both side surfaces of the light emitting element 350. In particular, since the length of the second insulating layer 520 disposed on the upper surface of the light emitting element 350 in the cross-section, measured in the uniaxial direction, is shorter than the length of the light emitting element 350, the second insulating layer 520 may be recessed inwardly from both side surfaces of the light emitting element 350. Accordingly, the side surfaces of the first insulating layer 510, the light emitting element 350, and the second insulating layer 520 may be laminated stepwise. In this case, the contact electrodes 361 and 362 to be described later may be brought into smooth contact with both ends of the light emitting element 350. However, the inventive concept are not limited thereto, and in some exemplary embodiments, the length of the second insulating layer 520 may be substantially the same as the length of the light emitting element 350, so that both sides thereof may be aligned with each other.

The second insulating layer 520 may be disposed to cover the first insulating layer 510, and then patterned to be in contact with the contact electrode 360 in a region where the light emitting element 350 is exposed. The process of patterning the second insulating layer 520 may be performed by a general dry etching or wet etching method. In this case, in order to prevent the first insulating layer 510 from being patterned, the first insulating layer 510 and the second insulating layer 520 may include materials having different etching selection ratios from each other. In particular, when patterning the second insulating layer 520, the first insulating layer 510 may function as an etching stopper.

Accordingly, even when the second insulating layer 520 covers the outer surface of the light emitting element 350, and is patterned to expose both ends of the light emitting element 350, the material of the first insulating layer 510 may not be damaged. In particular, the first insulating layer 510 and the light emitting element 350 may form a smooth contact surface at both ends of the light emitting element 350, at which the light emitting element 350 is in contact with the contact electrode 360. When the contact electrode 360 in contact with the light emitting element 350 is formed, voids from the patterning process may not be formed in the first insulating layer 510 that is in contact with the lower surface of the light emitting element 350, such that the contact electrode 360 may be prevented from being disconnected by the voids.

The first contact electrode 361 disposed on the first electrode 310 and overlapping at least a part of the second insulating layer 520, the second contact electrode 362 disposed on the second electrode 320 and overlapping at least a part of the second insulating layer 520, and the third contact electrode 363 disposed between the first contact electrode 361 and the second contact electrode 362 may be disposed on the second insulating layer 520.

The first contact electrode 361 and the second contact electrode 362 may be disposed on the upper surface of the first electrode 310 and the upper surface of the second electrode 320, respectively. More specifically, the first contact electrode 361 and the second contact electrode 362 may be in contact with the first electrode layer 312 and the second electrode layer 322, respectively, in the region where the first insulating layer 510 is patterned to expose a part of the first electrode 310 and a part of the second electrode 320. Each of the first contact electrode 361 and the second contact electrode 362 may be in contact with one end side surface of the light emitting element 350, for example, the first conductive semiconductor layer 351, the second conductive semiconductor layer 352, or the electrode material layer 357. As such, the first contact electrode 361 and the second contact electrode 362 may transmit electrical signals applied to the first electrode layer 312 and the second electrode layer 322 to the light emitting element 350.

The first contact electrode 361 may be disposed on the first electrode 310 to partially cover the first electrode 310, and may be partially in contact with the light emitting element 350, the first insulating layer 510, and the second insulating layer 520. One end of the first contact electrode 361 in a direction in which a third contact electrode 363 is disposed may be disposed on the second insulating layer 520. The second contact electrode 362 may be disposed on the second electrode 320 to partially cover the second electrode 320, and may be partially in contact with the light emitting element 350, the first insulating layer 510, and the second insulating layer 520. One end of the second contact electrode 362 in a direction in which the third contact electrode 363 is disposed may be disposed on the second insulating layer 520.

As shown in FIG. 1, the first contact electrode 361 or the second contact electrode 362 is not disposed on the first electrode hole CNTD and the second electrode contact hole CNTS disposed on the first electrode stem portion 310S and the second electrode stem portion 320S. More particularly, referring to FIG. 5, each of the first contact electrode 361 and the second contact electrode 362 may not overlap a region where the first electrode hole CNTD and the second electrode contact hole CNTS are disposed. However, the inventive concepts are not limited thereto. In some exemplary embodiments, a part of each of first contact electrode 361 and the second contact electrode 362 may be disposed in a region overlapping the first electrode hole CNTD and the second electrode contact hole CNTS on the first electrode 310 and the second electrode 320.

The third contact electrode 363 may be in contact with the other end side surface of the light emitting element 350, at which the light emitting element 350 does not contact the first contact electrode 361 or the second contact electrode 362. The third contact electrode 363 may partially contact the first insulating layer 510, the second insulating layer 520, and the third insulating layer 530. Both ends of the third contact electrode 363 may be disposed on the third insulating layer 530 to be electrically insulated from the first contact electrode 361 and the second contact electrode 362.

The first contact electrode 361 or the second contact electrode 362 may be spaced apart from the third contact electrode 363 on the second insulating layer 520 or the third insulating layer 530. In particular, the first contact electrode 361, the second contact electrode 362, and the third contact electrode 363 may be laminated so as to partially overlap the third insulating layer 530 in a vertical direction.

The second conductive electrode layer CEL2 including the first contact electrode 361 and the second contact electrode 362 may be disposed on the first conductive electrode layer CEL1 to partially contact the first conductive electrode layer CELL The third insulating layer 530 may be disposed on the second conductive electrode layer CEL2, and the third conductive electrode layer CEL3 including the third contact electrode 363 may be disposed on the third insulating layer 530. The third insulating layer 530 may electrically insulate the second conductive electrode layer CEL2 from the third conductive electrode layer CEL3. However, the inventive concepts are not limited thereto, and in some exemplary embodiments, the laminating sequence of the second conductive electrode layer CEL2 and the third conductive electrode layer CEL3 may be reversed. Meanwhile, in another exemplary embodiment, the third insulating layer 530 may be omitted, and the second conductive electrode layer CEL2 and the third conductive electrode layer CEL3 may be disposed on substantially the same plane. Details thereof will be described with reference to other embodiments.

In particular, the first contact electrode 361 and the second contact electrode 362 may be disposed on the upper surfaces of the first electrode 310 and the second electrode 320, respectively. Specifically, the first contact electrode 361 and the second contact electrode 362 may be in contact with the first electrode layer 312 and the second electrode layer 322 on the upper surfaces of the first electrode 310 and the second electrode 320. The region disposed to cover the first electrode 310 and the second electrode 320 on the upper surfaces of the first partition wall 410 and the second partition wall 420 may be patterned to expose the first electrode layer 312 and the second electrode layer 322, and thus, the first insulating layer 510 and the second insulating layer 520 may be electrically connected to the respective contact electrodes 361 and 362 in the exposed region.

The first contact electrode 361 and the second contact electrode 362 may be in contact with one end and the other end of the light emitting element 350, for example, the first conductive semiconductor layer 351 and the electrode material layer 357, respectively. Thus, the first contact electrode 361 and the second contact electrode 362 may transmit an electric signal applied to the first electrode layer 312 and the second electrode layer 322 to the light emitting element 350.

The first contact electrode 361 and the second contact electrode 362 may receive different power from the first thin film transistor 120 and the power supply wiring 161, respectively. For example, the first contact electrode 361 may receive a driving voltage applied from the first thin film transistor 120 to the first electrode 310, and the second contact electrode 362 may receive a common power supply voltage applied from the power supply wiring 161 to the second electrode 320. However, the inventive concepts are not limited thereto.

One end of the light emitting element 350 may be in contact with the first contact electrode 361 or the second contact electrode 362, and the other end thereof may be in contact with the third contact electrode 363. As described above, the light emitting elements 350 may include a first light emitting element 350*a* and a second light emitting element 350*b*, and the first light emitting element 350*a* and the second light emitting element 350*b* may receive different electric signals from the first contact electrode 361 and the second contact electrode 362, respectively. However, the other end of the first light emitting element 350*a* and the other end of the second light emitting element 350*b* may both contact the third contact electrode 363, so that the first light emitting element 350*a* and the second light emitting element 350*b* may be connected in series to receive different electrical signals from each other.

The contact electrodes 361, 362, and 363 may include a conductive material. For example, the contact electrodes 361, 362, and 363 may include ITO, IZO, ITZO, or aluminum (Al). However, the inventive concepts are not limited thereto.

Further, the contact electrodes 361, 362, and 363 may include substantially the same material as the electrode layers 312 and 322. The contact electrodes 361, 362, and 363 may be disposed in substantially the same pattern on the electrode layers 312 and 322 to contact the electrode layers 312 and 322. For example, the first contact electrode 361 contacting the first electrode layer 312 and the second contact electrode 362 contacting the second electrode layer 322 may receive electrical signals applied from the first electrode layer 312 and the second electrode layer 322, and transmit the electrical signals to the light emitting element 350.

The third insulating layer 530 may be disposed on the first contact electrode 361 and the second contact electrode 362 to electrically insulate the first contact electrode 361 and the second contact electrode 362 from the third contact electrode 363. The third insulating layer 530 may disposed to cover the first contact electrode 361 and the second contact electrode 362, and may be disposed not to overlap a part of the light emitting element 350 such that the light emitting element 350 is in contact with the third contact electrode 363. The third insulating layer 530 may partially contact the first contact electrode 361, the second contact electrode 362, and the second insulating layer 520 on the upper surface of the second insulating layer 520. The third insulating layer 530 may be disposed to cover one end of the first contact electrode 361 and one end of the second contact electrode 362 on the upper surface of the second insulating layer 520. Thus, the third insulating layer 530 may protect the first contact electrode 361 and the second contact electrode 362, and electrically insulate the first contact electrode 361 and the second contact electrode 362 from the third contact electrode 363.

One end of the third insulating layer 530 in a direction in which the third contact electrode 363 is disposed may be aligned with one side surface of the second insulating layer 520.

The passivation layer 550 may be formed on the third insulating layer 530 and the third contact electrode 363 to protect members disposed on the insulating substrate layer 300 from external environments. When the first contact electrode 361, the second contact electrode 362, and the third contact electrode 363 are exposed, a contact electrode material may be disconnected if an electrode is damaged. As such, the passivation may cover these members. More particularly, the passivation layer 550 may be disposed to cover the first electrode 310, the second electrode 320, the light emitting element 350, and the like. As described above, when the third insulating layer 530 is omitted, the passivation layer 550 may be formed on the first contact electrode 361, the second contact electrode 362, and the third contact electrode 363. In this case, the passivation layer 550 may electrically insulate the first contact electrode 361, the second contact electrode 362, and the third contact electrode 363 from each other.

Each of the first insulating layer 510, second insulating layer 520, third insulating layer 530, and passivation layer 550 may include an inorganic insulating material. For example, the first insulating layer 510, the second insulating layer 520, the third insulating layer 530, and the passivation layer 550 may include an inorganic insulating material, such as silicon oxide (SiOx), silicon nitride (SiNx), silicon oxynitride (SiOxNy), aluminum oxide (Al2O3), or aluminum nitride (AlN). The first insulating layer 510, the second insulating layer 520, the third insulating layer 530, and the passivation layer 550 may include substantially the same material, but may include different materials from each other in some exemplary embodiments. In addition, various materials providing insulating properties to the first insulating layer 510, the second insulating layer 520, the third insulating layer 530, and the passivation layer 550 may be applicable.

The first insulating layer 510 and the second insulating layer 520 may have different etching selection ratios, as described above. For example, when the first insulating layer 510 includes silicon oxide (SiOx), the second insulating layer 520 may include silicon nitride (SiNx). As another example, when the first insulating layer 510 includes silicon nitride (SiNx), the second insulating layer 520 may include silicon oxide (SiOx). However, the inventive concepts are not limited thereto.

As described above, the display device 10 according to an exemplary embodiment may include the first electrode 310 and the second electrode 320, and may include the first light emitting element 350*a* and the second light emitting element 350*b* disposed between the first electrode 310 and the second electrode 320, which are electrically connected by the third contact electrode 363. The first light emitting element 350*a* and the second light emitting element 350*b* may receive different electrical signals from the first electrode 310 and the second electrode 320, and may both be in contact with the third contact electrode 363 to be connected in series to each other. In this manner, the display device 10 can prevent defective light emission in the pixel PX even if any one of the light emitting elements 350 in one pixel PX is shorted.

The light emitting elements 350 may be manufactured on a substrate by an epitaxial growth method. The light emitting elements 350 may be manufactured by forming a seed crystal layer for forming a semiconductor layer on a substrate, and depositing a desired semiconductor material on the seed crystal layer to grow the seed crystal layer. Hereinafter, a structure of the light emitting element 350 according to exemplary embodiments will be described in detail with reference to FIG. 6.

Figure 6:
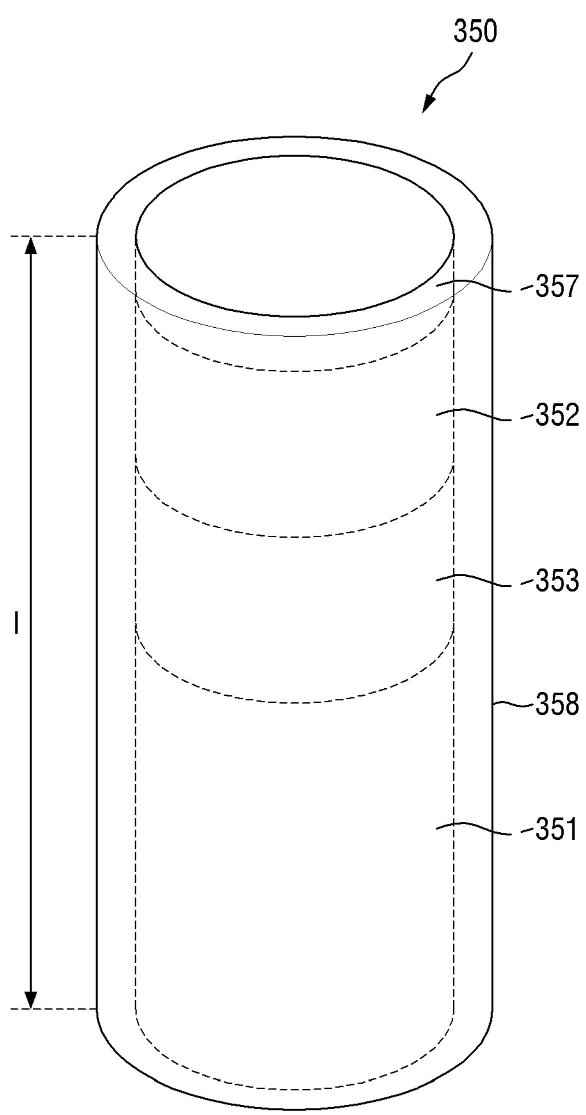
FIG. 6 is a schematic perspective view of a light emitting element according to an exemplary embodiment.

FIG. 6 is a schematic perspective view of a light emitting element according to an exemplary embodiment.

Referring to FIG. 6, the light emitting element 350 may include a plurality of conductive semiconductor layers 351 and 352, an active material layer 353 disposed between the plurality of conductive semiconductor layers 351 and 352, an electrode material layer 357, and an insulating material layer 358. The electrical signal applied from the first electrode 310 and the second electrode 320 may be transmitted to the active material layer 353 through the plurality of conductive semiconductor layers 351 and 352 to emit light.

More specifically, the light emitting element 350 may include a first conductive semiconductor layer 351, a second conductive semiconductor layer 352, an active material layer 353 disposed between the first conductive semiconductor layer 351 and the second conductive semiconductor layer 352, an electrode material layer 357 disposed on the second conductive semiconductor layer 352, and an insulating material layer 358. FIG. 6 exemplarily shows that the light emitting element 350 has a structure in which the first conductive semiconductor layer 351, the active material layer 353, the second conductive semiconductor layer 352, and the electrode material layer 357 are sequentially laminated, however, the inventive concepts are not limited thereto. In some exemplary embodiments, the electrode material layer 357 may be omitted. In some exemplary embodiments, the electrode material layer may also be disposed on at least one of both side surfaces of the first conductive semiconductor layer 351 and the second conductive semiconductor layer 352. Hereinafter, the light emitting element 350 will be described with reference to the structure shown in FIG. 6 as an example.

The first conductive semiconductor layer 351 may be an n-type semiconductor layer. For example, when the light emitting element 300 emits light of a blue wavelength band, the first conductive semiconductor layer 351 may be a semiconductor material having a formula of InxAlyGa1−x−yN (0≤x≤1, 0≤y≤1, 0≤x+y≤1). For example, the semiconductor material may be at least one of InAlGaN, GaN, AlGaN, InGaN, AlN, and InN, which are doped with an n-type semiconductor. The first conductive semiconductor layer 351 may be doped with a first conductive dopant, and, for example, the first conductive dopant may be Si, Ge, Sn, or the like. The length of the first conductive semiconductor layer 351 may be in the range of about 1.5 μm to about 5 μm, without being limited thereto.

The second conductive semiconductor layer 352 may be a p-type semiconductor layer. For example, when the light emitting element 300 emits light of a blue wavelength band, the second conductive semiconductor layer 352 may be a semiconductor material having a formula of InxAlyGa1−x−yN (0≤x≤1, 0≤y≤1, 0≤x+y≤1). For example, the semiconductor material may be at least one of InAlGaN, GaN, AlGaN, InGaN, AlN, and InN, which are doped with a p-type semiconductor. The second conductive semiconductor layer 352 may be doped with a second conductive dopant, and, for example, the second conductive dopant may be Mg, Zn, Ca, Se, Ba, or the like. The length of the second conductive semiconductor layer 352 may be in the range of about 0.08 μm to about 0.25 μm, without being limited thereto.

The active material layer 353 may be disposed between the first conductive semiconductor layer 351 and the second conductive semiconductor layer 352, and may include a material having a single or multiple quantum well structure. When the active material layer 353 includes a material having a multiple quantum well structure, in which a plurality of quantum layers and a plurality of well layers are alternately laminated. The active material layer 353 may emit light by coupling of electron-hole pairs according to an electrical signal applied through the first conductive semiconductor layer 351 and the second conductive semiconductor layer 352. For example, when the active material layer 353 emits light of a blue wavelength band, it may include a material, such as AlGaN or AlInGaN. In particular, when the active material layer 353 has a multiple quantum well structure in which a plurality of quantum layers and a plurality of well layers are alternately laminated, the quantum layer may include a material, such as AlGaN or AlInGaN, and the well layer may include a material, such as GaN or AlGaN. However, the inventive concepts are not limited thereto. The active material layer 353 may have a structure in which semiconductor materials having high bandgap energy and semiconductor materials having low bandgap energy are alternately laminated, and may include other Group semiconductor materials depending on the wavelength band of the emitted light. Accordingly, light emitted from the active material layer 353 is not limited to light of a blue wavelength band, and in some exemplary embodiments, the active material layer 353 may emit light of a red wavelength band or light of a green wavelength band. The length of the active material layer 353 may be in the range of about 0.05 μm to about 0.25 μm, without being limited thereto.

Light emitted from the active material layer 353 may be emitted not only onto the outer surface of the light emitting element 300 in the length direction, but also onto both side surfaces thereof. More particularly, the direction of light emitted from the active material layer 353 is not limited to one direction.

The electrode material layer 357 may be an ohmic contact electrode. However, the inventive concepts are not limited thereto, and the electrode material layer 357 may be a Schottky contact electrode in some exemplary embodiments. The electrode material layer 357 may include a conductive metal. For example, the electrode material layer 357 may include at least one of aluminum (Al), titanium (Ti), indium (In), gold (Au), and silver (Ag). The electrode material layer 357 may include substantially the same material, or may also include different materials. However, the inventive concepts are not limited thereto.

The insulating material layer 358 may be formed at the outside of the light emitting element 350 to protect the light emitting element 350. For example, the insulating material layer 358 is formed to surround the side surface of the light emitting element 350, and thus, may not be formed at both ends of the light emitting element 300 in the length direction, for example, at both ends thereof at which the first conductive semiconductor layer 351 and the second conductive semiconductor layer 352 are disposed. However, the inventive concepts are not limited thereto. The insulating material layer 358 may include a material having insulating properties, such as silicon oxide (SiOx), silicon nitride (SiNx), silicon oxynitride (SiOxNy), aluminum nitride (AlN), or aluminum oxide ($Al_2O_3$). Accordingly, it is possible to prevent an electrical short that may occur when the active material layer 353 is in direct contact with the first electrode 310 or the second electrode 320.

The insulating material layer 358 may extend in the length direction to cover the first conductive semiconductor layer 351 to the electrode material layer 357. However, the inventive concepts are not limited thereto. The insulating material layer 358 may cover only the first conductive semiconductor layer 351, the active material layer 353, and the second conductive semiconductor layer 352, or may cover only a part of the outer surface of the electrode material layer 357 to expose a part of the outer surface of the electrode material layer 357.

Further, in some exemplary embodiments, the insulating material layer 358 may be surface-treated so as to be dispersed in a solution without being agglomerated with another insulating material layer 358. When aligning the light emitting elements to be described later, the light emitting elements 350 in the solution may be maintained in a dispersed state, so that the light emitting elements 350 may be independently aligned between the first electrode 310 and the second electrode 320. For example, the insulating material layer 358 may be hydrophobically or hydrophilically surface-treated, so that the light emitting elements 350 may be maintained in a state in which the light emitting elements 350 are dispersed with each other in the solution.

The length of the insulating material layer 358 may be in the range of about 0.5 μm to about 1.5 μm, without being limited thereto.

The light emitting element 350 may have a substantially cylindrical shape. However, the inventive concepts are not limited to a particular shape of the light emitting element 350, and in some exemplary embodiments, the light emitting element 350 may have various shapes, such as a substantially cubical shape, a substantially rectangular parallelepiped shape, and a substantially hexagonal column shape. The length of the light emitting element 350 may be in the range of about 1 μm to about 10 μm, or about 2 μm to about 5 μm, and preferably may be about 4 μm. The diameter of the light emitting element 350 may be in the range of about 400 nm to about 700 nm, and preferably may be about 500 nm.

Hereinafter, a method of manufacturing a display device 10 according to an exemplary embodiment will be described in detail with reference to FIGS. 7 to 21.

FIGS. 7 to 21 are plan views and cross-sectional views schematically illustrating a method of manufacturing a display device according to an exemplary embodiment. Hereinafter, a procedure of manufacturing the display device 10 of FIG. 1 is shown in plan views, and the order in which a plurality of members are laminated in each plan view is shown in cross-sectional views. That is, the cross-sectional views shown below show the order in which the cross-sectional structures of the corresponding plan views are formed.

Meanwhile, in the following cross-sectional views, the connecting structure between the electrodes 310 and 320 with the first thin film transistor 120 or the power supply wiring 161 through the fourth contact hole 319_1 and the fifth contact hole 319_2 of FIG. 5 will be omitted. In addition, the order in which each of the electrodes 310 and 320, the light emitting element 350, the contact electrode 360, and the plurality of insulating layers are laminated will be described in detail.

Figure 7:
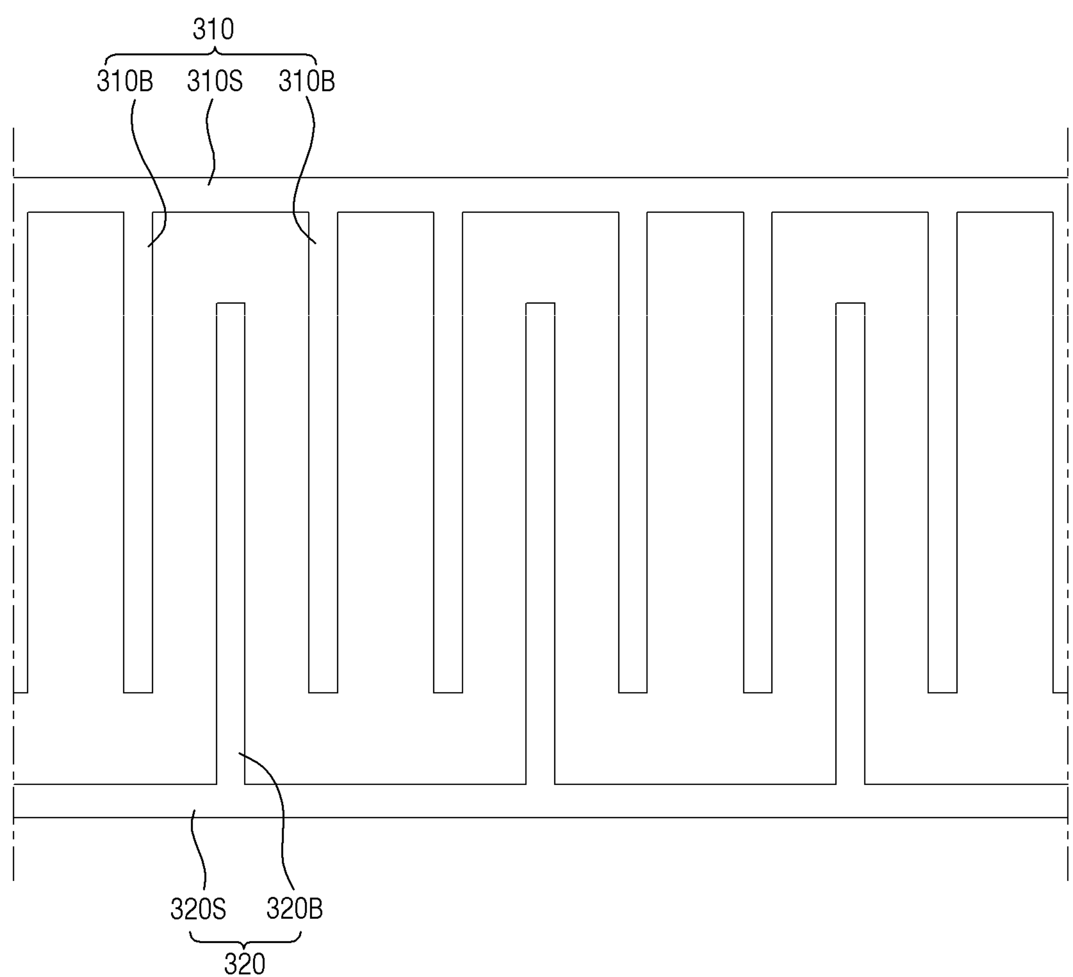
FIGS. 7, 8, 9, 10, 11, 12, 13, 14, 15, 16, 17, 18, 19, 20, and 21 are plan views and cross-sectional views schematically illustrating a method of manufacturing a display device according to an exemplary embodiment.
Figure 8:
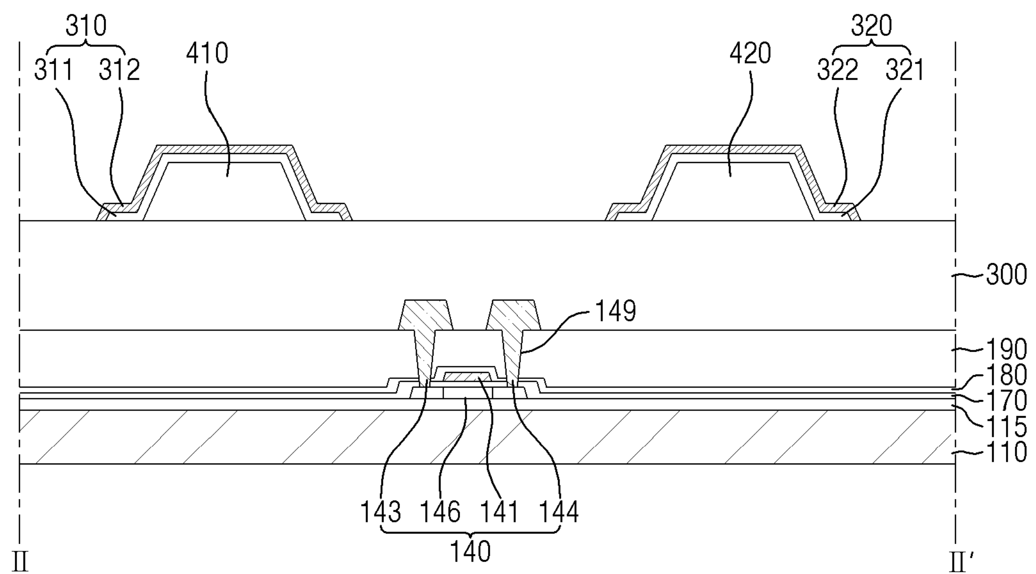
Figure 9:
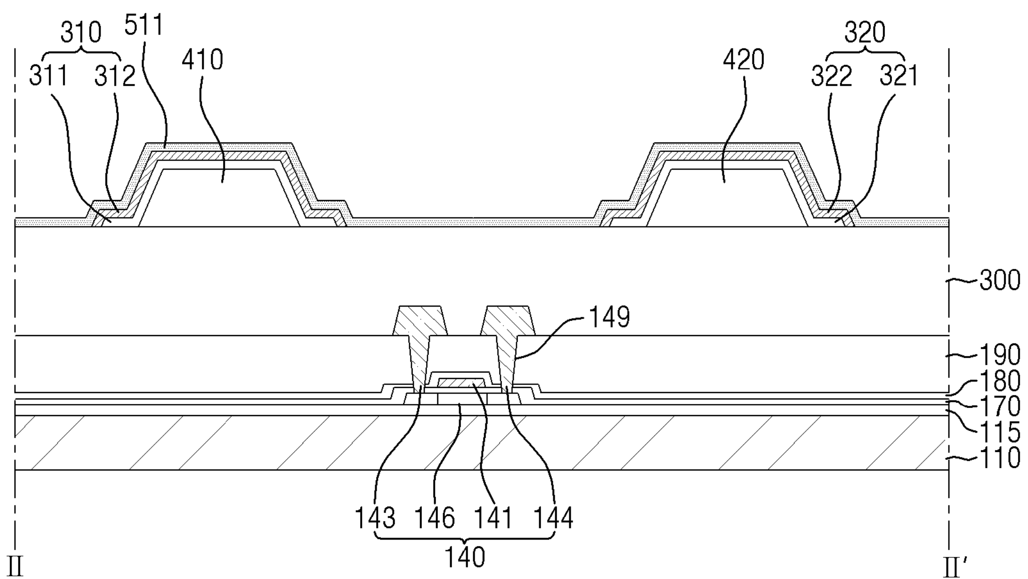

First, referring to FIGS. 7 to 9, a plurality of electrodes 310 and 320 are formed on the insulating substrate layer 300. The process of forming the plurality of electrodes 310 and 320 may be performed by patterning a metal or an organic material through a general mask process, for example.

As described above with reference to FIG. 1, the first electrode stem portion 310S and the second electrode stem portion 320S substantially extend in the first direction D1, and are spaced apart from each other and face each other. Although FIG. 1 shows that the first electrode stem portions 310S are electrically separated and spaced apart from each other between neighboring pixels PX, in FIG. 7, one end of the first electrode stem portion 310*s* may also extend to a plurality of adjacent pixels PX. One end of the first electrode stem portion 310S and one end of the second electrode stem portion 320S may be connected to a signal application pad, and thus, AC power may be applied when aligning the light emitting elements 350, which will be described later.

The first electrode branch portion 310B and the second electrode branch portion 320B are branched from the first electrode stem portion 310S and the second electrode stem portion 320S, respectively, and substantially extend in the second direction D2. As described above, the first electrode branch portion 310B and the second electrode branch portion 320B extend in directions opposite to each other, and are spaced apart from the second electrode stem portion 320S and the first electrode stem portion 310S, respectively.

In particular, the first electrode 310 and second electrode 320 of FIG. 7 are substantially the same as the first electrode 310 and second electrode 320 of FIG. 1, except that the first electrode stem portion 310S of FIG. 7 extends to the neighboring pixel PX and is electrically connected to the first electrode stem portion 310S of each pixel PX. A detailed description thereof will be omitted.

FIGS. 8 and 9 are cross-sectional views showing a procedure in which the plurality of electrodes 310 and 320 shown in FIG. 7 are formed.

Referring to FIG. 8, a first partition wall 410 and a second partition wall 420 are disposed on the insulating substrate layer 300 to be spaced apart from each other, and the first electrode 310 and the second electrode 320 are disposed to cover first partition wall 410 and the second partition wall 420, respectively. As described above, the members may be formed by patterning a metal or an organic material through a general mask process. In the following cross-sectional views, the process of forming each of the members will be omitted. The first electrode 310 and the second electrode 320 may form a first conductive electrode layer CEL1.

Referring to FIG. 9, a first insulating material layer 511 is formed to cover the first electrode 310 and the second electrode 320. The first insulating material layer 511 is patterned in a subsequent process to be described later to form the first insulating layer 510 of FIG. 5. The first insulating material layer 511 is not shown in FIG. 7, but may be disposed to the first electrode branch portion 310B and the second electrode branch portion 320B. However, the inventive concepts are not limited thereto, and in some exemplary embodiments, the first insulating material layer 511 may cover the first electrode stem portion 310S and the second electrode stem portion 320S.

Figure 10:
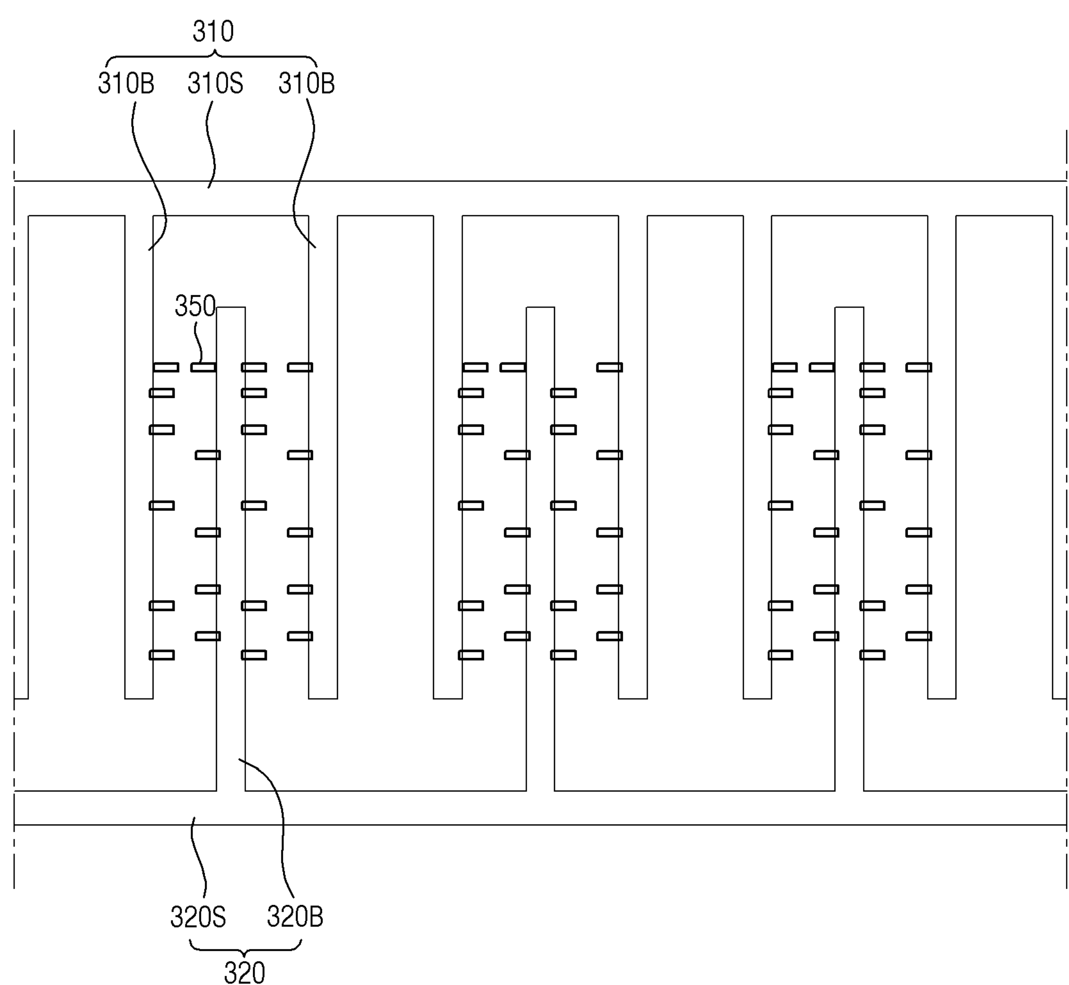
Figure 11:
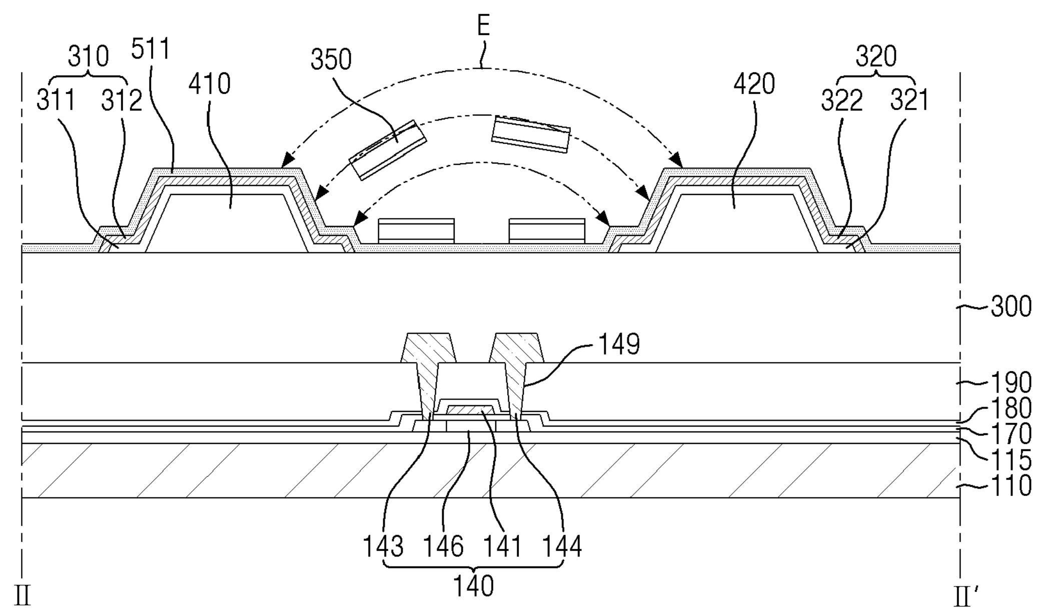
Figure 12:
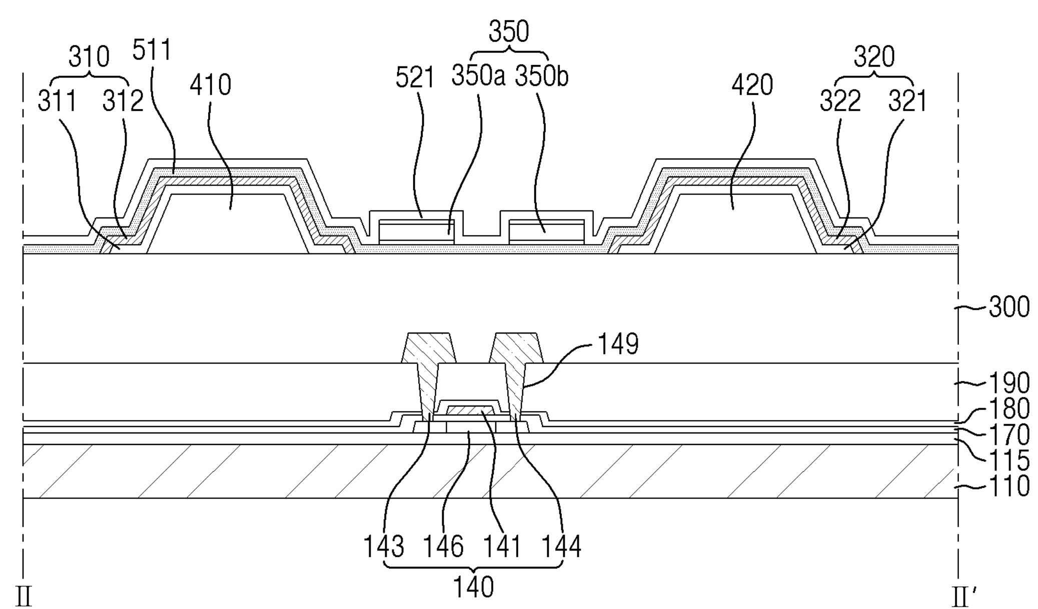
Figure 13:
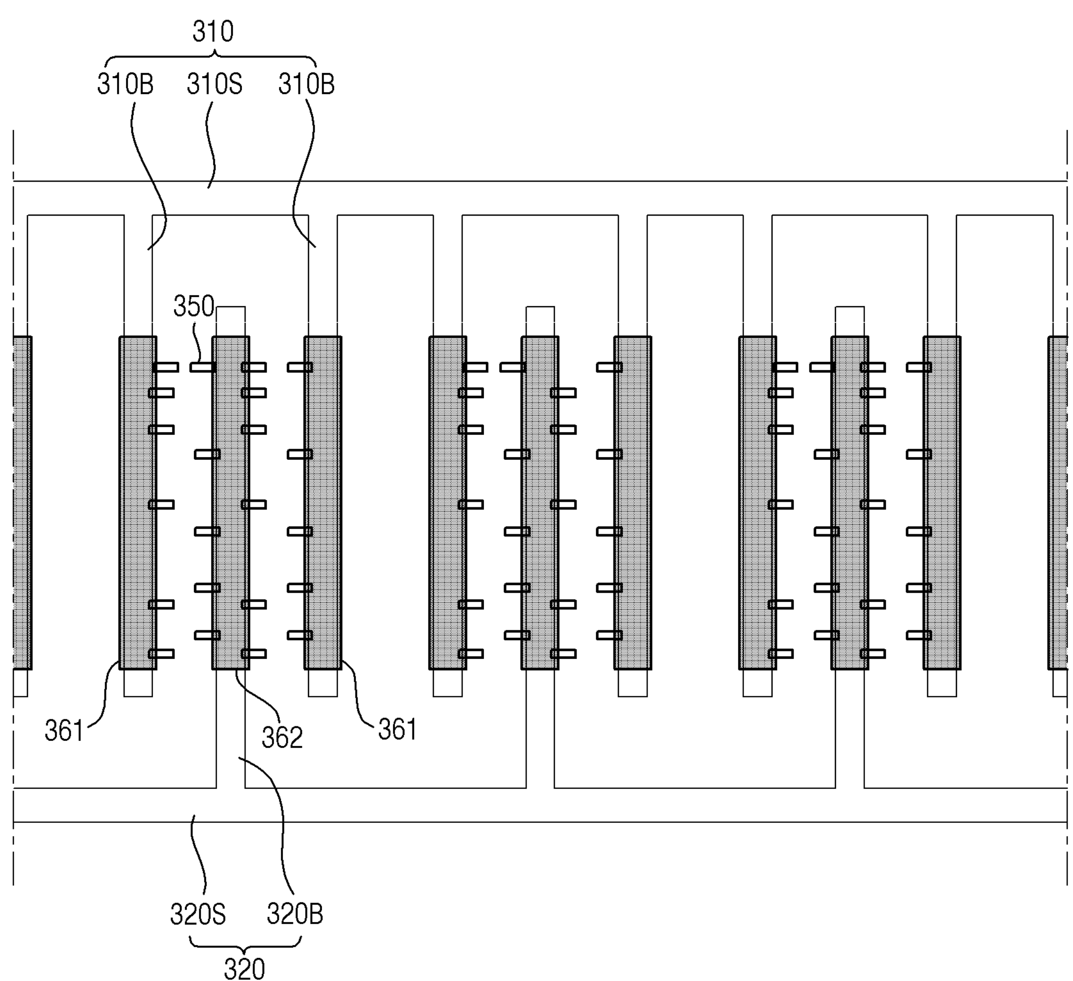

Next, referring to FIGS. 10 to 12, light emitting elements 350 are disposed between the first electrode branch portion 310B and the second electrode branch portion 320B. The light emitting elements 350 may include a first light emitting element 350*a* having one end electrically connected to the first electrode branch portion 310B and a second light emitting element 350*b* having one end electrically connected to the second electrode branch portion 320B. The plurality of light emitting elements 350 may be aligned by dielectrophoresis (DEP).

FIGS. 11 and 12 are cross-sectional views showing a procedure for aligning the light emitting elements 350 shown in FIG. 10.

First, referring to FIG. 11, a solution containing the light emitting elements 350 is applied between the first electrode 310 (or the first electrode branch 310B) and the second electrode 320 (or the second electrode branch 320B). The solution may have a formulation such as ink or paste, and may include a solvent such as acetone, water, alcohol, or toluene. However, the solution is not particularly limited as long as the solution can be vaporized at room temperature or by heat.

Next, an AC power is applied to the first electrode 310 and the second electrode 320, and a capacitance from an electric field E is formed between the first electrode 310 and the second electrode 320. When the capacitance is formed, bipolarity is induced in the light emitting elements 350 under a non-uniform electric field E, and the light emitting elements 350 are subjected to a dielectrophoresis force (DEP force). Therefore, the light emitting elements 350 may be aligned between the first electrode 310 and the second electrode 320 by the dielectrophoretic force. For example, one end of the light emitting element 350 may be connected to the first electrode 310, and the other end thereof may be connected to the second electrode 320.

The dielectrophoretic force applied to the light emitting element 350 by the capacitance may cause the light emitting element 350 to have certain directionality between the electrodes 310 and 320. For example, the first conductive semiconductor layer 351 of the light emitting element 350 may be connected to the side surface of the first electrode branch portion 310B or the second electrode branch portion 320B, and the second conductive semiconductor layer 352 of the light emitting element 350 may be connected to the side surface of the second electrode branch portion 320B or the first electrode branch portion 310B. However, the inventive concepts are not limited thereto, and the light emitting elements 350 may be aligned in any direction between the electrodes 310 and 320. The second insulating material layer 521 may be patterned in a subsequent process to be described late to form the second insulating layer 520. Here, the first insulating material layer 511 functions as an etching stopper, and thus, only the second insulating material layer 521 may be selectively patterned.

Next, referring to FIG. 12, a second insulating material layer 521 is formed to cover the first insulating material layer 511 and the light emitting element 350. The second insulating material layer 521 is disposed on the upper surface of the light emitting element 350 in a cross-section, but may substantially cover the outer surface of the light emitting element 350. Accordingly, the light emitting element 350 may be fixed between the first electrode 310 and the second electrode 320. Further, as described above, the second insulating material layer 521 may include a material having a different etching selection ratio from the first insulating material layer 511.

Although not shown in FIG. 10, like the first insulating material layer 511, the second insulating material layer 521 may be disposed to cover the first electrode branch portion 310B and the second electrode branch portion 320B. However, the inventive concepts are not limited thereto, and in some exemplary embodiments, the second insulating material layer 521 may cover the first electrode stem portion 310S and the second electrode stem portion 320S.

As describe above, the form in which the light emitting elements 350 are aligned is not limited to the forms shown in the drawings. The light emitting elements 350 may be spaced apart from each other as shown in the drawings. However, in some exemplary embodiments, some of the light emitting elements 350 may partially overlap each other in one direction, while being spaced apart from each other.

Next, referring to FIGS. 13 to 17, a first contact electrode 361 and a second contact electrode 362 are formed on the first electrode branch portion 310B and the second electrode branch portion 320B, respectively, which are in contact with one end of the light emitting element 350. One end of the first light emitting element 350*a* may be in contact with the first contact electrode 361, and one end of the second light emitting element 350*b* may be in contact with the second contact electrode 362.

FIGS. 14 to 17 are cross-sectional views schematically showing a procedure of forming the first contact electrode 361 and the second contact electrode 362 which are in contact with one end of the first light emitting element 350*a* and one end of the second light emitting element 350*b*, respectively.

Figure 14:
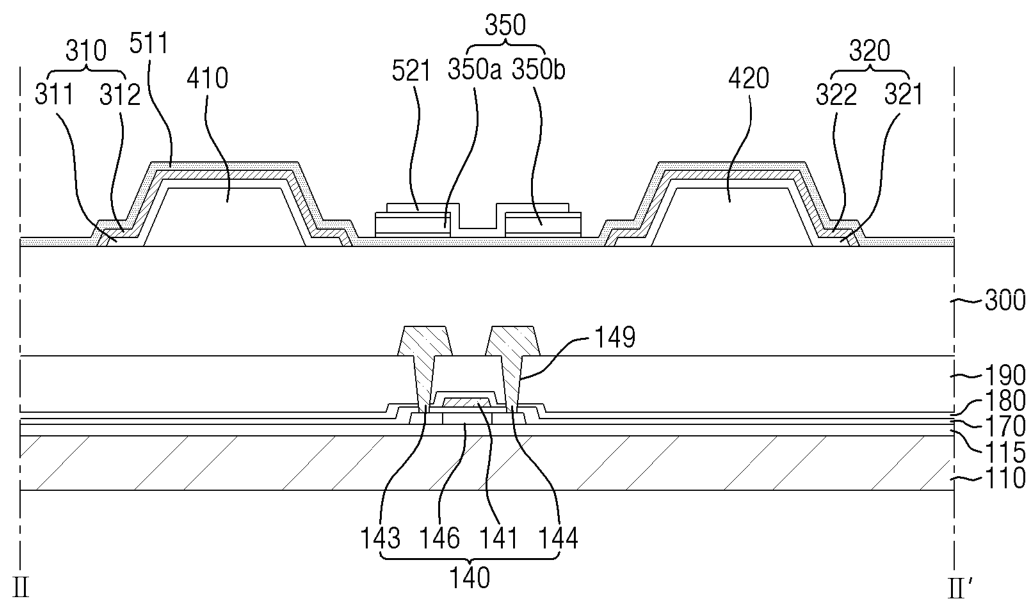

First, referring to FIG. 14, the second insulating material layer 521 is patterned such that the first insulating material layer 511 disposed on the first electrode 310 and the second electrode 320 is partially exposed, and one end of the first light emitting element 350*a* and one end of the second light emitting element 350*b* are exposed. Since the second insulating material layer 521 includes a material having a different etching selection ratio from the first insulating material layer 511, only the second insulating material layer 521 may be selectively patterned. Thus, when one end of the first light emitting element 350*a* and one end of the second light emitting element 350*b* are exposed, the contact surface of the first insulating material layer 511 with the lower surfaces of the first light emitting element 350*a* and the second light emitting element 350*b* may extend substantially horizontally toward each of the electrodes 310 and 320, to facilitate smooth contact.

Figure 15:
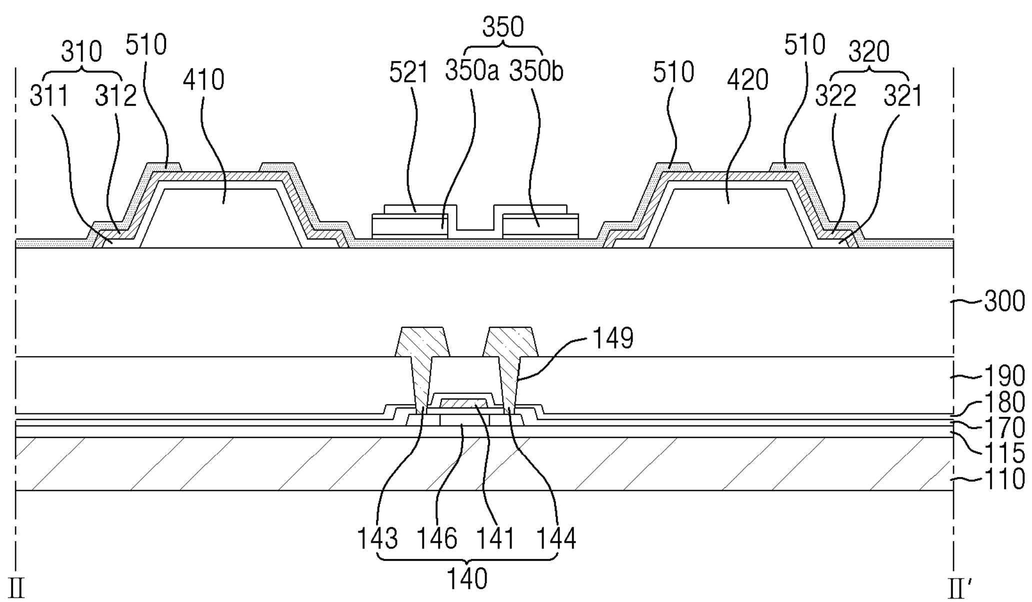

Next, referring to FIG. 15, the first insulating material layer 511 is patterned such that a part of the first electrode 310 and a part of the second electrode 320 are exposed. FIG. 15 exemplarily shows that a region where the first insulating material layer 511 is in contact with the upper surface of the first electrode 310 and the upper surface the second electrode 320 is patterned. However, the inventive concepts are not limited thereto, and in some exemplary embodiments, a region where the first insulating material layer 511 is in contact with the inclined side surface of the first electrode 310 and the inclined side surface of the upper surface the second electrode 320 may be patterned. Here, a part of the first insulating material layer 511 is exposed, thereby forming the first insulating layer 510.

Figure 16:
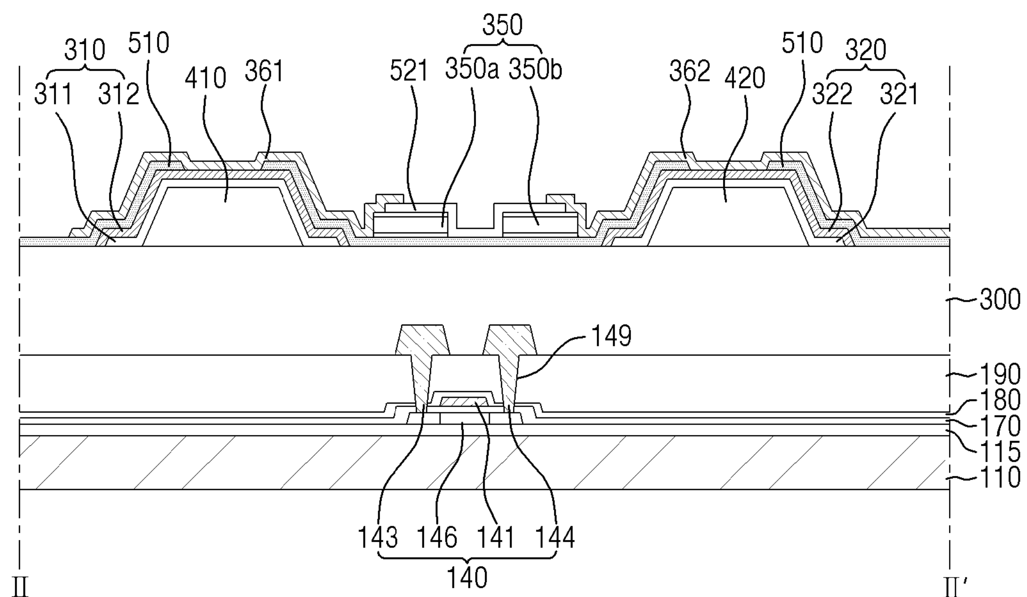

Next, referring to FIG. 16, a first contact electrode 361 contacting one end side surface of the first light emitting element 350*a* and a second contact electrode 362 contacting one end side surface of the second light emitting element 350*b* are formed. The first contact electrode 361 may be disposed to cover the first electrode 310, the first insulating material layer 511, and a part of the second insulating material layer 521, and may also be in contact with the exposed first electrode 310 shown in FIG. 15. The second contact electrode 362 may be disposed to cover the second electrode 320, the first insulating material layer 511, and a part of the second insulating material layer 521, and may also be in contact with the exposed second electrode 320 shown in FIG. 15.

As described above, since the contact surface of the first insulating material layer 511 with the lower surfaces of the first light emitting element 350*a* and the second light emitting element 350*b* extends substantially horizontally toward each of the electrodes 310 and 320, the electrode material of the first contact electrode 361 and second contact electrode 362 contacting one end side surface of each of the light emitting elements 350*a* and 350*b* may be smoothly connected. The first contact electrode 361 and the second contact electrode 362 may be disposed on the first conductive electrode layer CEL1 to form a second conductive electrode layer CEL2.

Figure 17:
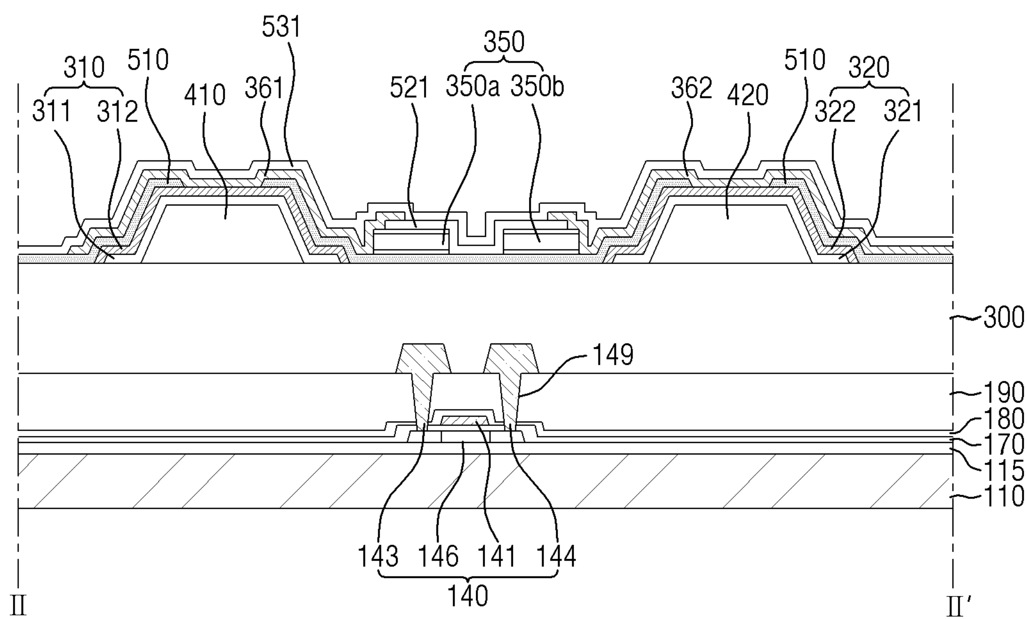

Next, referring to FIG. 17, a third insulating material layer 531 is formed to cover the second conductive electrode CEL2 and the second insulating material layer 521. The third insulating material layer 531 may be patterned in a subsequent process to be described later to form a third insulating layer 530. The third insulating material layer 531 may protect the first contact electrode 361 and the second contact electrode 362, and electrically insulate the first contact electrode 361 and the second contact electrode 362 from the third contact electrode 363. The third insulating material layer 531 may include a material having substantially the same etching selection ratio as the second insulating material layer 521, such that the third insulating material layer 531 and the second insulating material layer 521 may be simultaneously patterned. However, the inventive concepts are not limited thereto.

Figure 18:
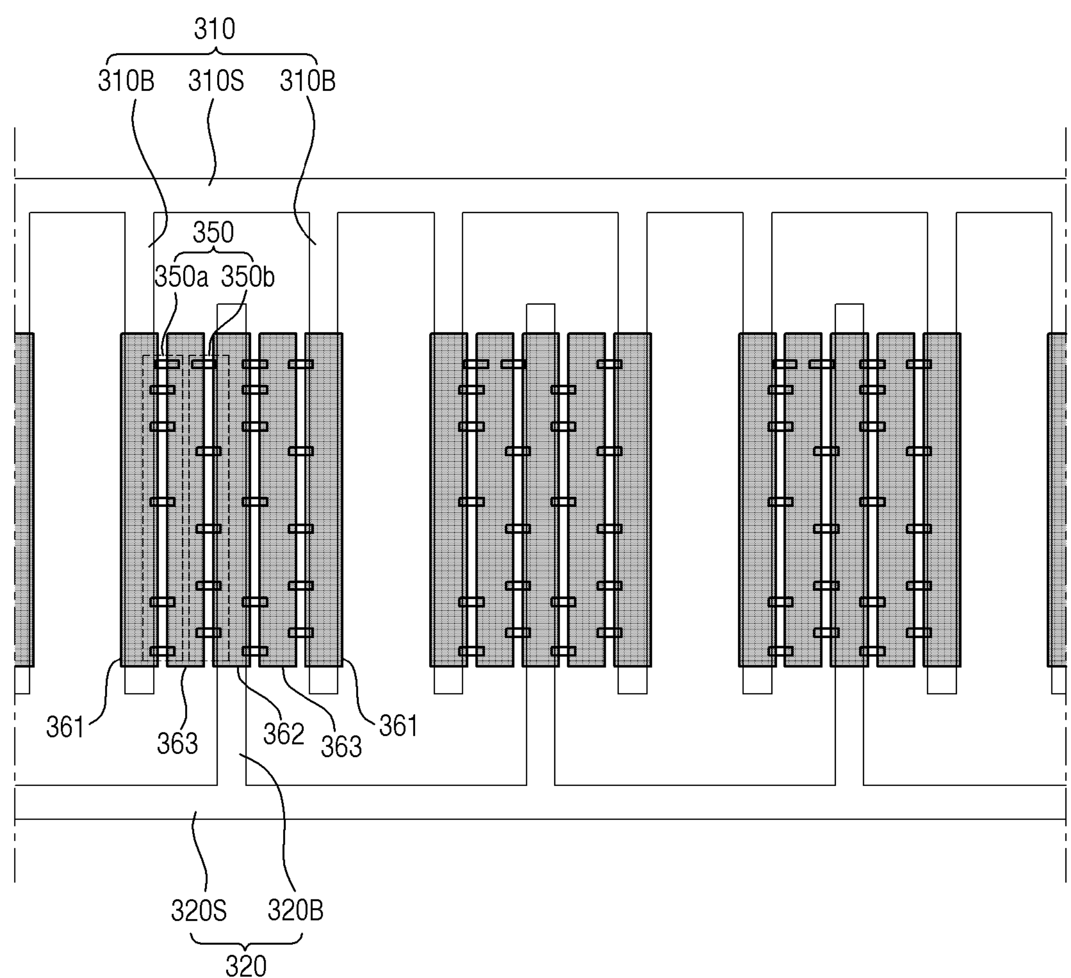
Figure 19:
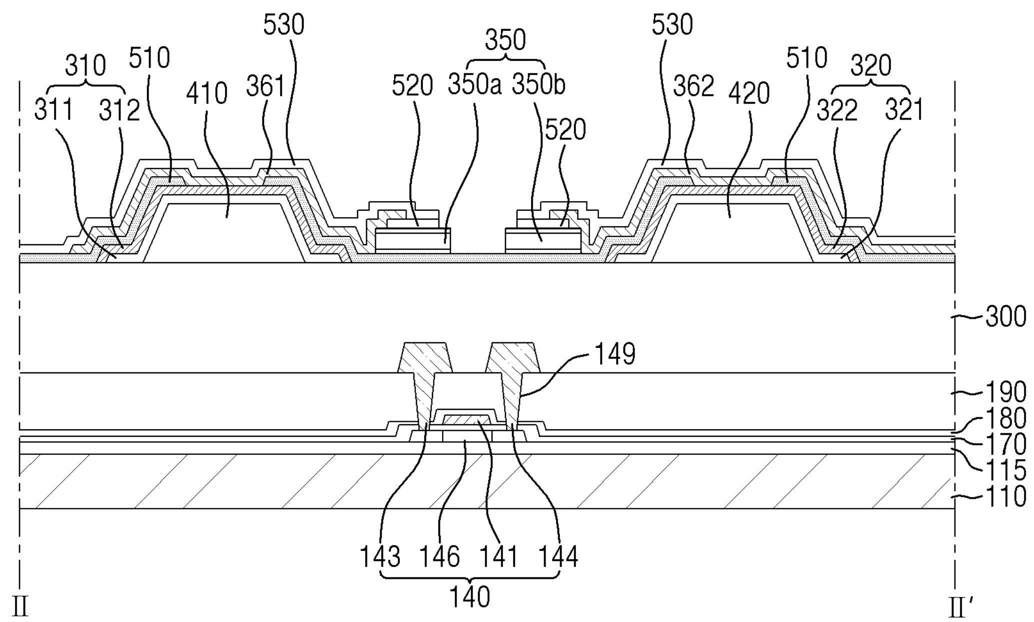
Figure 20:
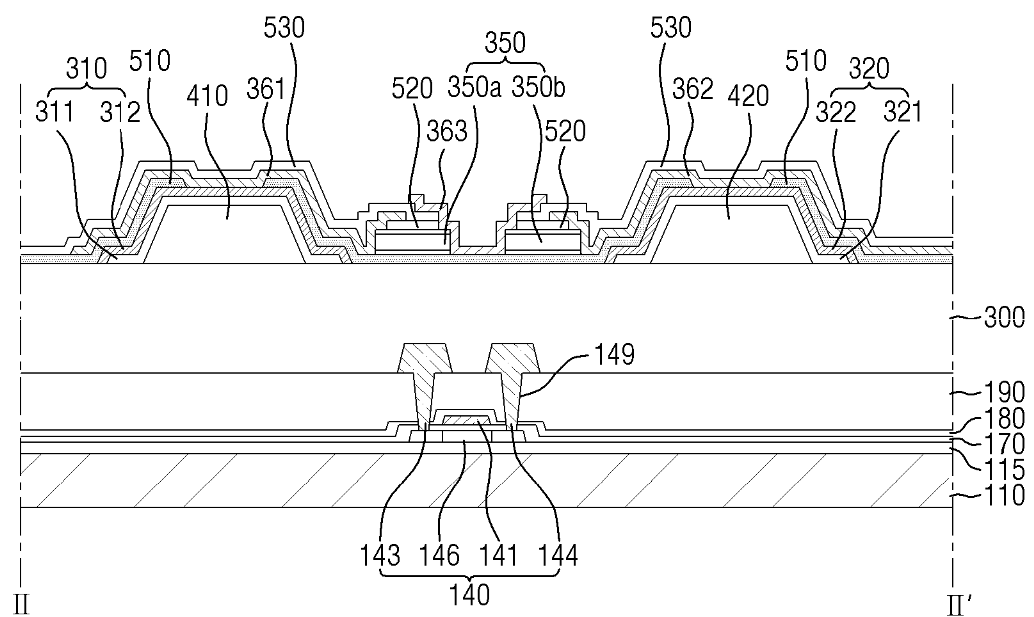

Next, referring to FIGS. 18 to 20, a third contact electrode 363 is formed between the first contact electrode 361 and the second contact electrode 362. The third contact electrode 363 may simultaneously contact the other end of the first light emitting element 350*a* and the other end of the second light emitting element 350*b*.

FIGS. 19 and 20 are cross-sectional views schematically showing a procedure of forming the contact electrode 363.

First, referring to FIG. 19, the second insulating material layer 521 and the third insulating material layer 531 are patterned such that the opposing ends of the first light emitting element 350*a* and the second light emitting element 350*b* and the first insulating layer 510 disposed therebetween are exposed. Here, a part of the second insulating material layer 521 and a part of the third insulating material layer 531 are patterned, so as to form the first insulating layer 520 and the third insulating layer 530, respectively. The second insulating material layer 521 and the third insulating material layer 531 may be simultaneously patterned in one process, and one end of the second insulating layer 520 and one end of the third insulating layer 530 may be aligned with each other.

Next, referring to FIG. 20, a third contact electrode 363 is formed to simultaneously contact with the other end of the first light emitting element 350*a* and the other end of the second light emitting element 350*b*. The third contact electrode 363 may be disposed to cover the first insulating layer 510 and a part of the third insulating layer 530, and may be in contact with the opposing side surfaces of the ends of the first light emitting element 350*a* and the second light emitting element 350*b* as shown in FIG. 19.

As described above, since the contact surface of the first insulating layer 510 with the lower surfaces of the first light emitting element 350*a* and the second light emitting element 350*b* may extend substantially horizontally in a direction opposite to the direction of each of the electrodes 310 and 320, the electrode material of the third contact electrode 363 contacting the opposing end side surfaces of the light emitting elements 350*a* and 350*b* may be smoothly connected. The third contact electrode 363 may be disposed on the third insulating layer 530 to form a third conductive electrode layer CEL3. The third conductive electrode layer CEL3 may be disposed on the second conductive electrode layer CEL2.

A passivation layer 550 is disposed on the third conductive electrode layer CEL3 to cover the plurality of members disposed on the insulating substrate layer 300. The structure or arrangement of the passivation layer 550 are substantially the same as those described above.

Figure 21:
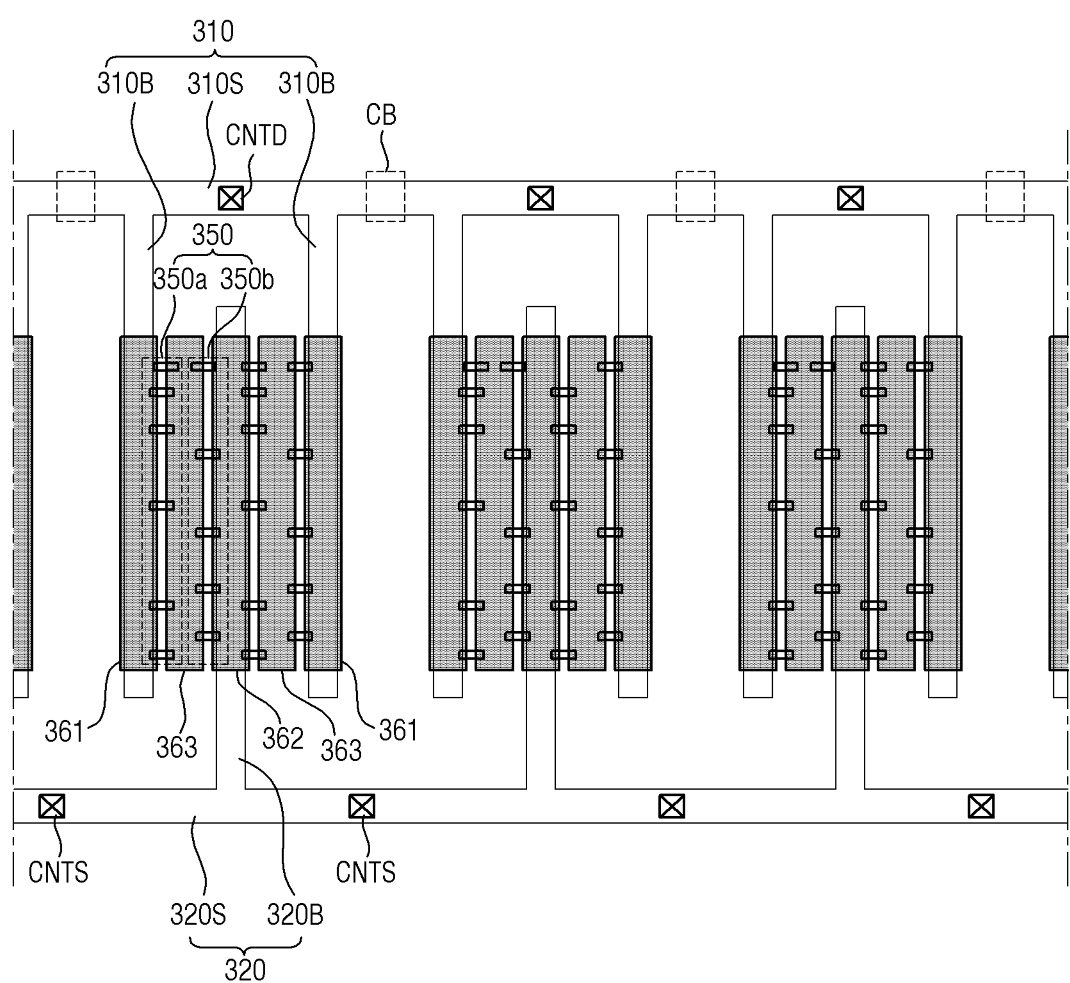

Referring to FIG. 21, the first electrode stem portion 310S may be electrically separated along cutting portions CB, so as to manufacture the display device 10 of FIG. 1. The method of electrically separating the first electrode stem portion 310S is not particularly limited. For example, the first electrode 310 located at the cut portion CB may be disconnected by using a laser. Accordingly, the first electrode stem portion 310S may be disposed in a state where the first electrode stem portion 310S is electrically separated between the neighboring pixels PX.

The first electrode 310 and the second electrode 320 may be electrically connected to the first thin film transistor 120 and the power supply electrode 162 through the first electrode contact hole CNTD on the first electrode stem portion 310S and the second electrode contact hole CNTS on the second electrode stem portion 320S. Accordingly, a current from a driving voltage and a power supply voltage may flow between the first electrode 310 and the second electrode 320. The first light emitting element 350*a* and the second light emitting element 350*b*, which are disposed between the first electrode 310 and the second electrode 320, may be connected in series.

As described above, in the display device 10 according to an exemplary embodiment, the third contact electrode 363 may be disposed between the first electrode branch portion 310B and the second electrode branch portion 320B, and thus, the light emitting elements 350 arranged between the electrodes may be connected in series. Accordingly, in the driving of the display device 10, voltage distribution efficiency, capacity design of the thin film transistor, power loss due to wire resistance, and the like may be improved.

Hereinafter, a display device 10 according to another exemplary embodiment will be described.

The arrangement of the second conductive electrode layer CEL2 provided with the first contact electrode 361 and the second contact electrode 362, and the third conductive electrode layer CEL3 provided with the third contact electrode 363 is not limited to that of the display device shown in FIG. 1. For example, the third conductive electrode layer CEL3 may be disposed at a lower position than the second conductive electrode layer CEL2 in a cross-sectional view, and the second conductive electrode layer CEL2 and the third conductive electrode layer CEL3 may be disposed substantially on the same plane. Hereinafter, a display device according to still another exemplary embodiment will be described.

Figure 22:
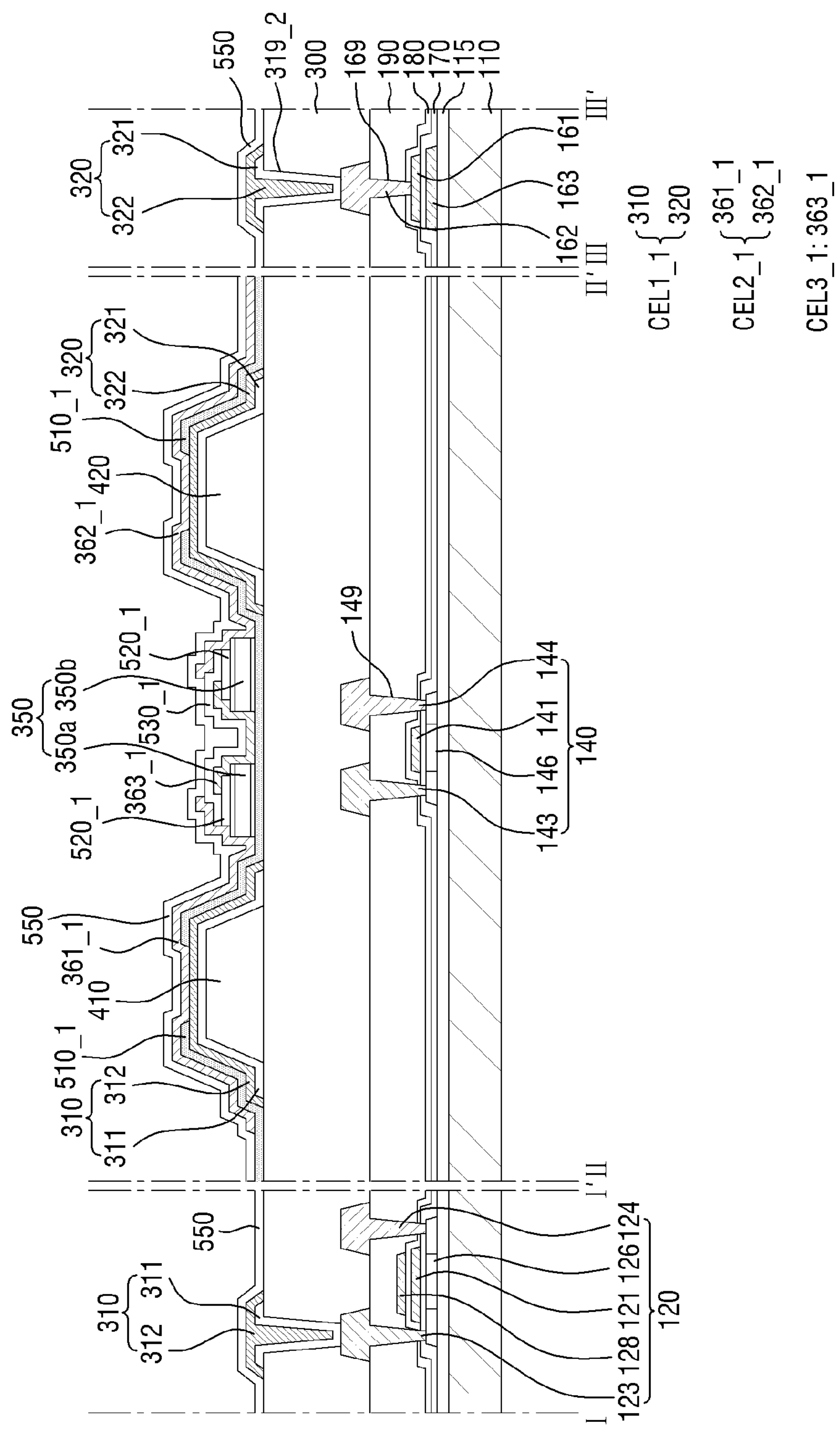
FIG. 22 is a cross-sectional view of a display device according to another exemplary embodiment.

FIG. 22 is a cross-sectional view of a display device according to another exemplary embodiment, and FIGS. 23 to 26 are plan views and cross-sectional views illustrating some processes of a method of manufacturing the display device of FIG. 22.

Referring to FIG. 22, a display device 10_1 may be configured such that a third conductive electrode layer CEL3_1 is disposed at a lower position than a second conductive electrode layer CEL2_1 in a cross-sectional view. In particular, in the display device 10_1 of FIG. 22, a third contact electrode 363_1 may be disposed at a lower position than a first contact electrode 361_1 and a second contact electrode 362_1. Thus, a third insulating layer 530_1 may be disposed to cover the third contact electrode 363_1, and the first contact electrode 361_1 and the second contact electrode 362_1 may be disposed on the third insulating layer 530_1.

The third contact electrode 363_1 is not in contact with a first conductive electrode layer CEL1_1 forming the first electrode 310 and the second electrode 320. The first conductive electrode layer CEL1_1 is in contact with the second conductive electrode layer CEL2_1. This arrangement of the second conductive electrode layer CEL2_1 and the third conductive electrode layer CEL3_1 may be formed when the third conductive electrode layer CEL3_1 is arranged prior to the second conductive electrode layer CEL2_1 during the process of manufacturing the display device 10_1.

Figure 23:
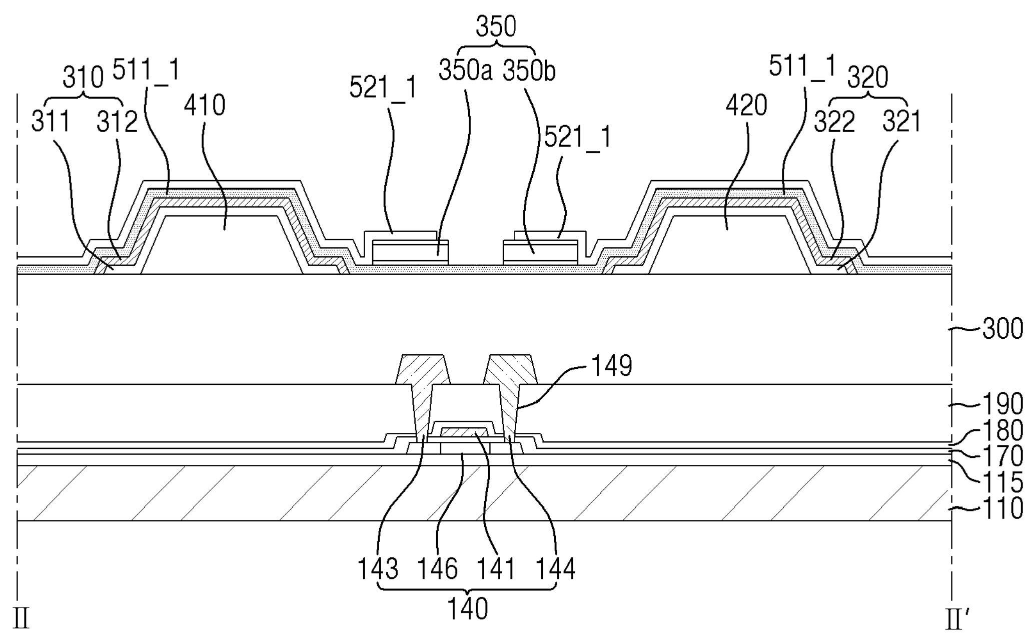
FIGS. 23, 24, 25, 26, and 27 are plan views and cross-sectional views illustrating some of the steps of a method of manufacturing the display device of FIG. 22 according to an exemplary embodiment.

First, referring to FIG. 23, a second insulating material layer 521_1 is patterned such that the opposing ends of the first light emitting element 350*a* and the second light emitting element 350*b* are exposed as shown in FIG. 12. Unlike the display device 10 of FIG. 1, the order of patterning the second insulating material layer 521_1 may be changed, such that the third conductive electrode layer CEL3_1 is disposed first.

Figure 24:
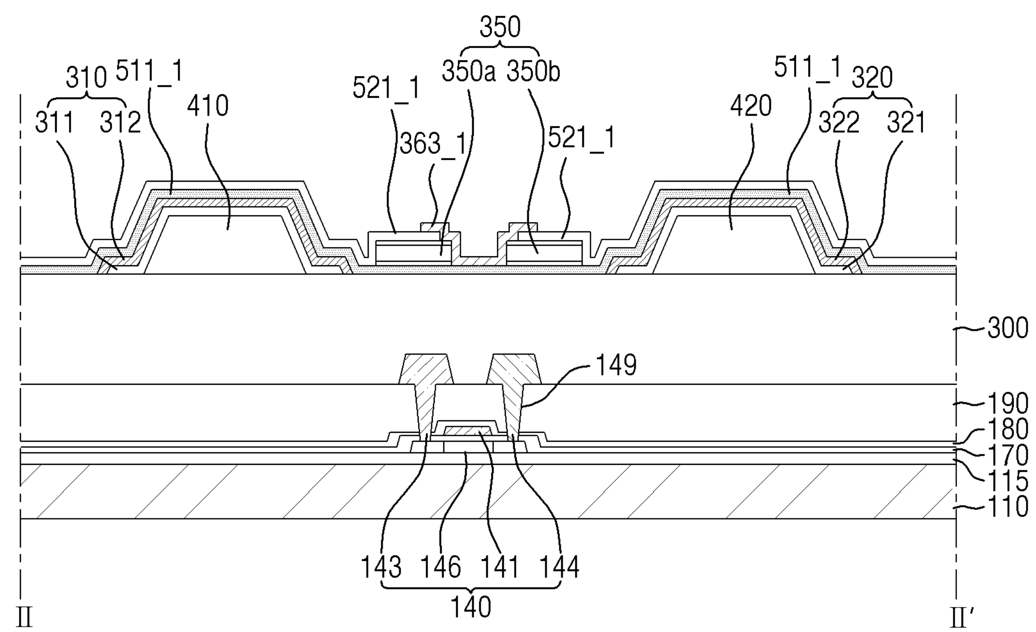

Next, referring to FIG. 24, a third contact electrode 363_1 is formed so as to be in contact with the side surfaces of the exposed ends of the first light emitting element 350*a* and the second light emitting element 350*b* and a part of the second insulating material layer 521_1. The third contact electrode 363_1 may form the third conductive electrode layer CEL3_1.

Figure 25:
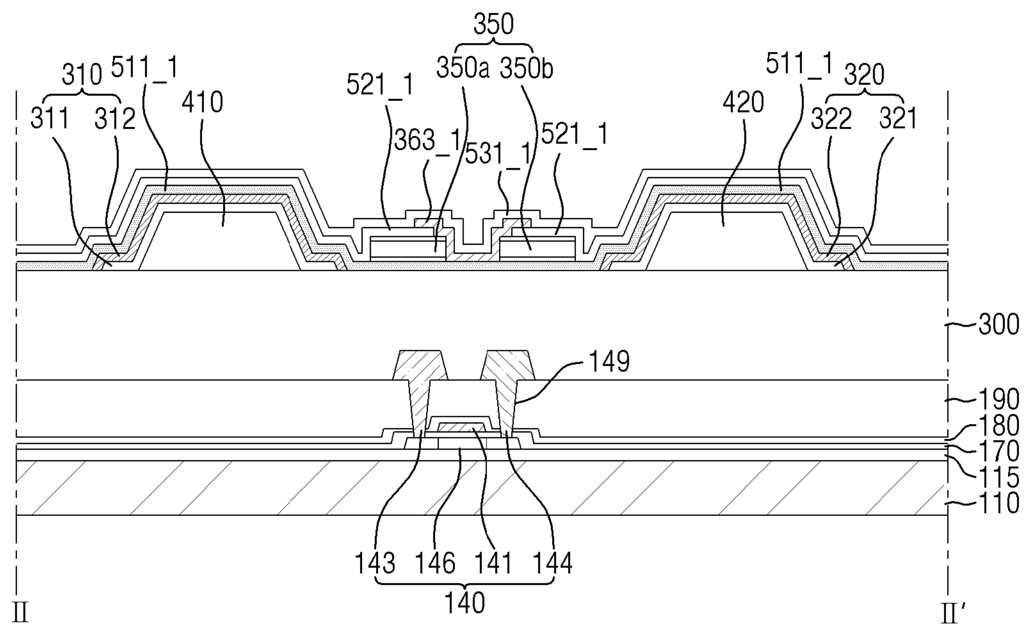

Next, referring to FIG. 25, a third insulating material layer 531_1 is formed so as to cover the third contact electrode 363_1 and the second insulating material layer 521_1. The third insulating material layer 531_1 may electrically insulate the third conductive electrode layer CEL3_1 from the second conductive electrode layer CEL2_1.

Figure 26:
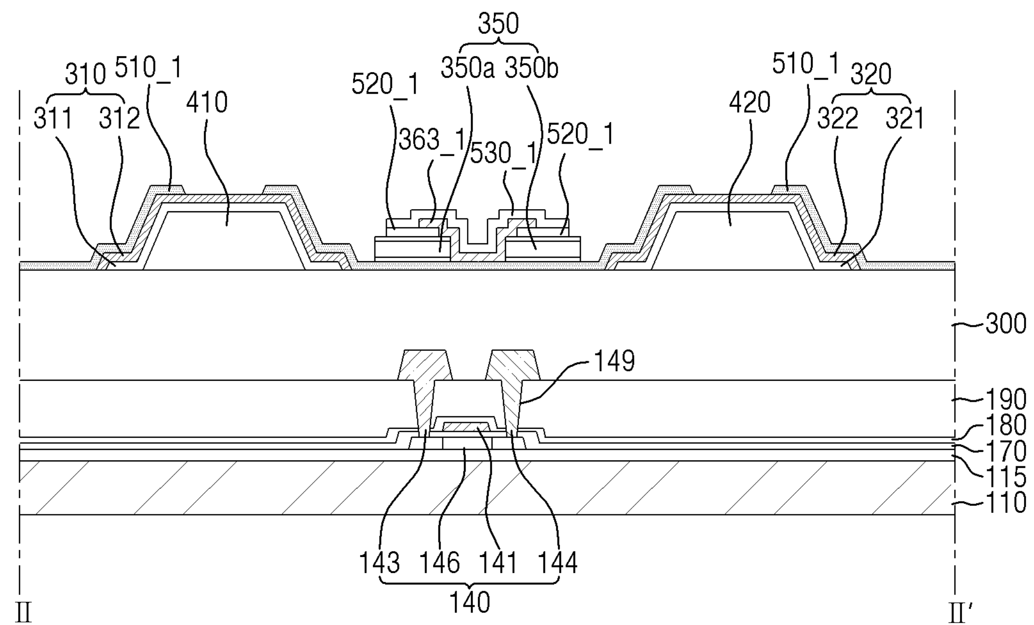
Figure 27:
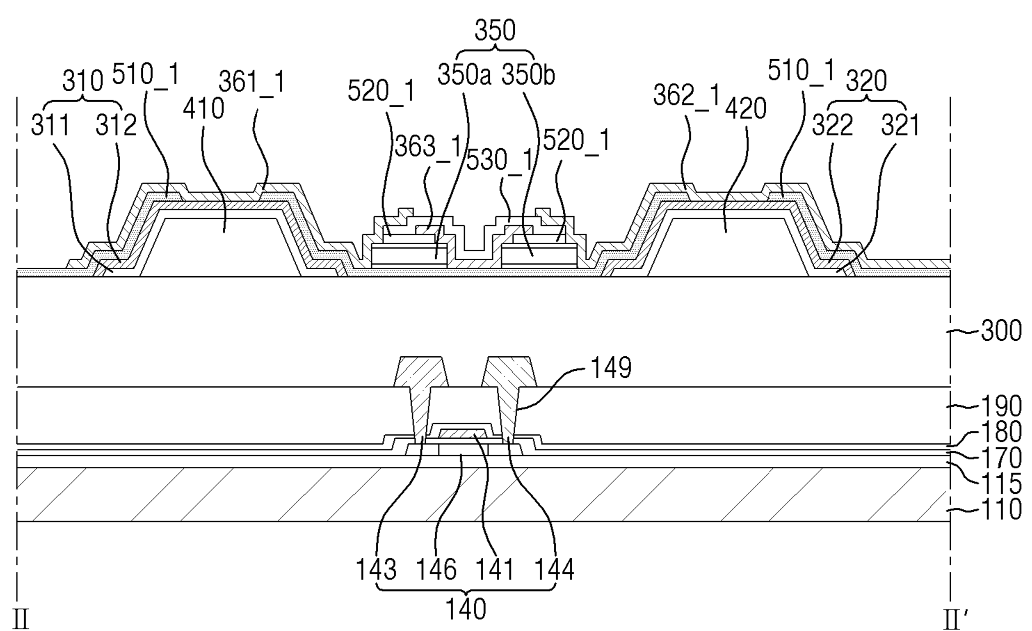

Next, referring to FIGS. 26 and 27, the second insulating material layer 521_1 and the third insulating material layer 531_1 are patterned so as to expose one end of each of the first light emitting element 350*a* and the second light emitting element 350*b* in a direction toward each of the electrodes 310 and 320. A part of a first insulating material layer 511_1 is patterned so as to expose a part of the first electrode 310 and a part of the second electrode 320. Then, a first contact electrode 361_1 and a second contact electrode 362_1 are formed. Here, the first contact electrode 361_1 and the second contact electrode 362_1 may form the second conductive electrode layer CEL2_1, and may be in contact with the first conductive electrode layer CEL1_1.

Unlike the display device 10 of FIG. 1, the display device 10_1 of FIG. 22 may be configured such that the third conductive electrode layer CEL3_1, the third insulating layer 530_1, and the second conductive electrode layer CEL2_1 are laminated in a cross-sectional view. However, as described above, the first conductive electrode layer CEL1_1 may be in contact with only the second conductive electrode layer CEL2_1, and the third conductive electrode layer CEL3_1 may be formed as a floating electrode, to which no electric signal is directly applied from each of the electrodes 310 and 320.

Further, as described above, the second conductive electrode layer CEL2 and the third conductive electrode layer CEL3 may be disposed on substantially the same layer.

Figure 28:
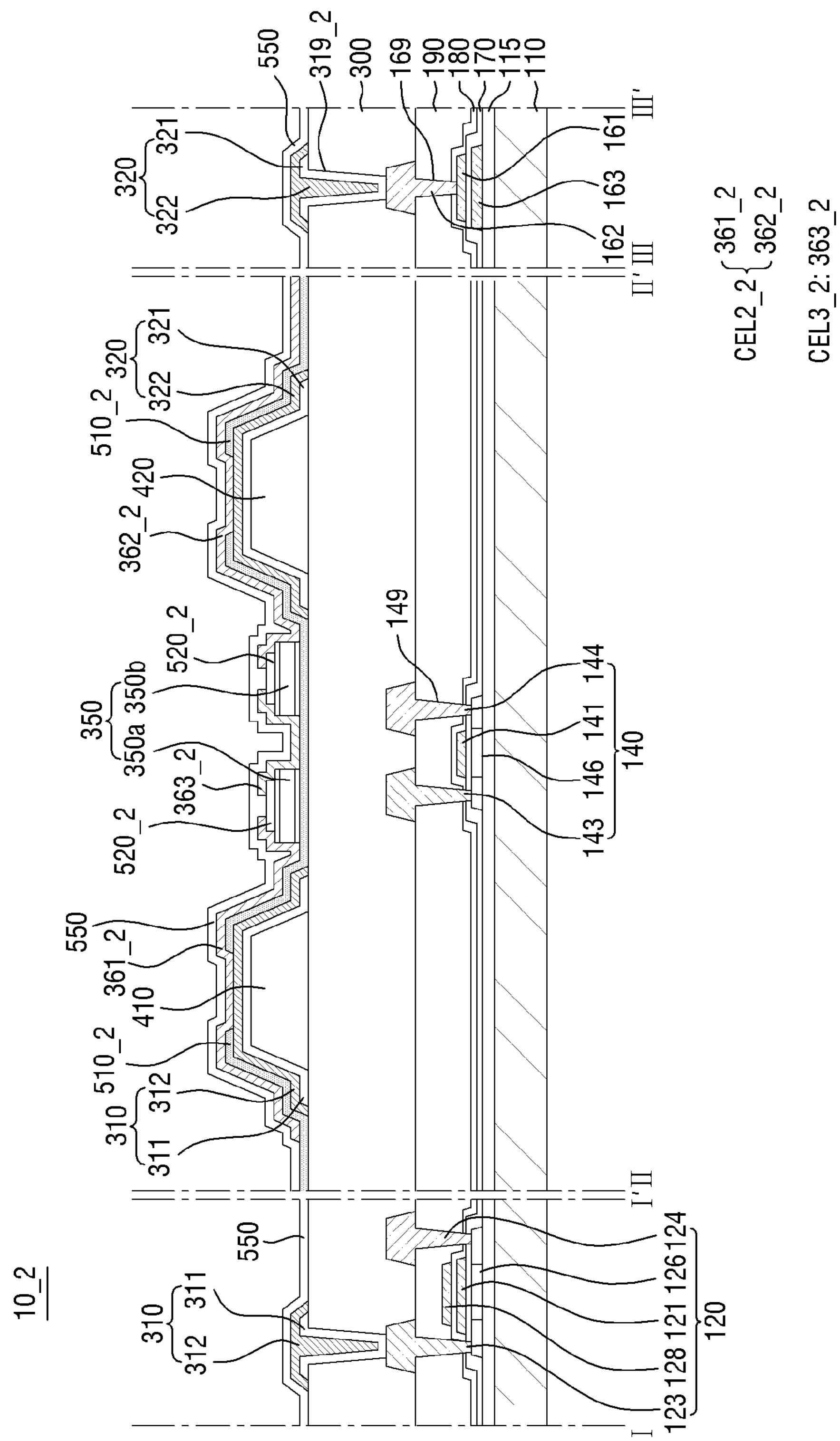
FIG. 28 is a cross-sectional view of a display device according to still another exemplary embodiment.
Figure 29:
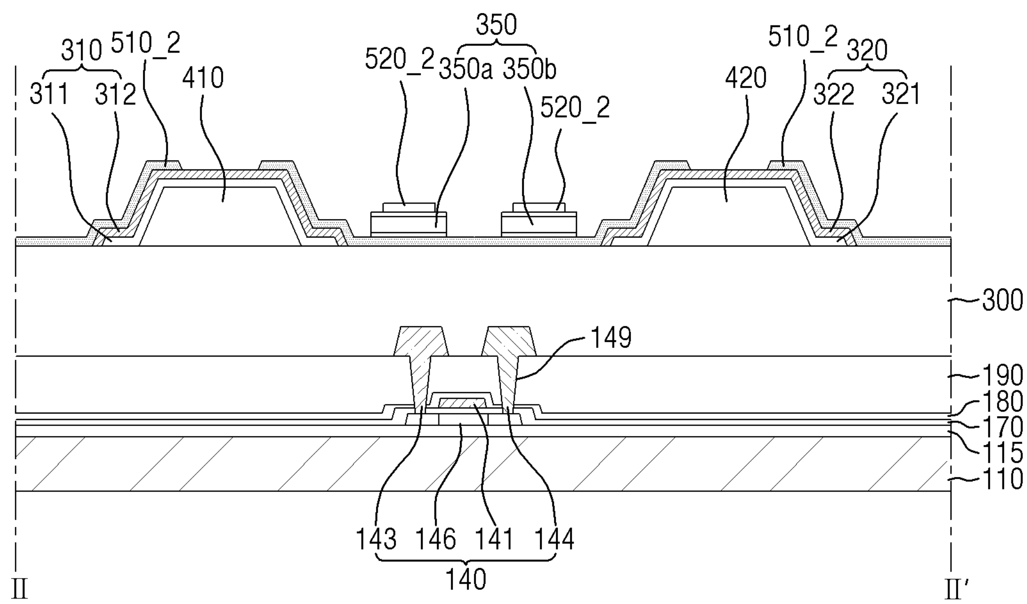
FIGS. 29 and 30 are cross-sectional views illustrating some of the steps of a method of manufacturing the display device of FIG. 28 according to an exemplary embodiment.
Figure 30:
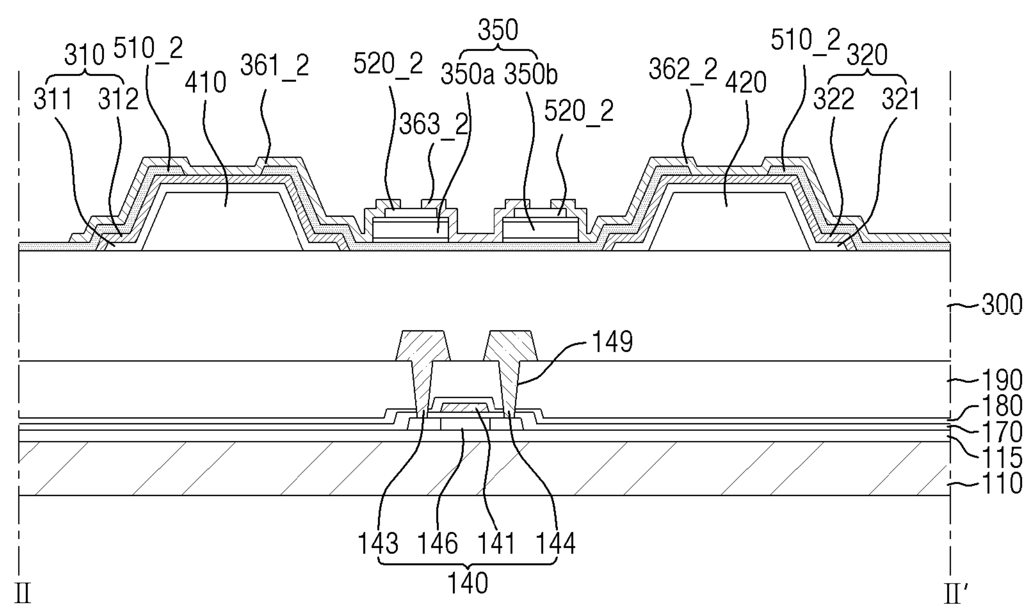

FIG. 28 is a cross-sectional view of a display device according to still another exemplary embodiment, and FIGS. 29 and 30 are cross-sectional views illustrating some processes of a method of manufacturing the display device of FIG. 28.

Referring to FIG. 28, a display device 10_2 may be configured such that a third conductive electrode layer CEL3_2 is disposed on substantially the same layer as a second conductive electrode layer CEL2_2. In this case, the third insulating layer 350 may be omitted. This arrangement of the second conductive electrode layer CEL2_2 and the third conductive electrode layer CEL3_2 may be formed when the third conductive electrode layer CEL3_2 and the second conductive electrode layer CEL2_2 are formed simultaneously during the process of manufacturing the display device 10_2.

First, referring to FIG. 29, the second insulating material layer 521 is patterned such that both ends of each of the first light emitting element 350*a* and the second light emitting element 350*b* are simultaneously exposed, as shown in FIG. 12, so as to form a second insulating layer 520_2. In the display device 10_1 of FIG. 22, unlike the display device 10 of FIG. 1, the second insulating material layer 521 may be patterned together with the first electrode 310 and the second electrode 320 in a region between the first electrode 310 and the second electrode 320, such that the third conductive electrode layer CEL3_2 and the second conductive electrode layer CEL2_2 are simultaneously placed. After the second insulating layer 520_2 is formed, the first insulating material layer 511 is patterned such that the first electrode 310 and a part of the second electrode 320 are exposed, so as to form a first insulating layer 510_2.

Next, referring to FIG. 30, a first contact electrode 361_2, a second contact electrode 362_2, and a third contact electrode 363_2 may be simultaneously disposed in one process. Thus, the second conductive electrode layer CEL2_2 and the third conductive electrode layer CEL3_2 may be disposed on substantially the same layer. However, the first contact electrode 361_2 and the second contact electrode 362_2 may be spaced apart from each other on the third contact electrode 363_2 and the second insulating layer 520_2, respectively, and a passivation layer 550 may be disposed in the spaced region as shown in FIG. 28. The passivation layer 550 may protect the first contact electrode 361_2, the second contact electrode 362_2, and the third contact electrode 363_2, and may electrically insulate them from each other.

The display device according to exemplary embodiments may include light emitting elements, both ends of each which are electrically connected to a first electrode and a third contact electrode or are electrically connected to a third contact electrode and a second electrode. The light emitting elements may be partially connected in series, thereby improving voltage distribution efficiency, the capacity design of a thin film transistor, and the loss due to the wire resistance, in the driving of the display device.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:

a first electrode and a second electrode spaced apart from each other, and the first electrode and the second electrode extending in a first direction;

a first light emitting element of which a first end is disposed on the first electrode;

a second light emitting element of which a first end is disposed on the second electrode;

a first contact electrode disposed on the first electrode and electrically contact with the first end of the first light emitting element by directly contacting a vertical edge of the first end of the first light emitting element in a thickness direction intersecting the first direction;

a second contact electrode disposed on the second electrode and electrically contact with the first end of the second light emitting element by directly contacting a vertical edge of the first end of the second light emitting element;

a third contact electrode spaced apart from the first contact electrode and the second contact electrode; and a third insulating layer having a first part overlapping the first light emitting element including the first end thereof and directly on the first contact electrode, and a second part spaced apart from the first part and overlapping the second light emitting element including the first end thereof and directly on the second contact electrode:

wherein the third contact electrode is electrically contact with a second end of the first light emitting element by directly contacting a vertical edge of the second end of the first light emitting element and a second end of the second light emitting element by directly contacting a vertical edge of the second end of the second light emitting element;

the first light emitting element and the second light emitting element each comprise a top surface extending, in the first direction, from a top end of the vertical edge of the corresponding first end to a top end of the vertical edge of the corresponding second end directly contacting the third contact electrode, and the third contact electrode is directly on the first part of the third insulating layer and extending continuously in the first direction to be directly on the second part of the third insulating layer.

2. The display device of claim 1, further comprising:

a first insulating layer disposed on the first electrode and the second electrode, wherein the first light emitting element and the second light emitting element are disposed on the first insulating layer.

3. The display device of claim 2, further comprising:

a second insulating layer disposed on at least portion of the first light emitting element and the second light emitting element;

the third insulating layer disposed on the second insulating layer and overlapping at least one end of the first light emitting and the second light emitting element.

4. The display device of claim 3, wherein the first contact electrode and the second contact electrode are disposed on the third insulating layer, and the third contact electrode is disposed between the second insulating layer and the third insulating layer.

5. The display device of claim 1, wherein the first light emitting element and the second light emitting element comprise:

a first semiconductor layer;

a second semiconductor layer;

an active layer disposed between the first semiconductor layer and the second semiconductor layer; and at least one insulating film covering at least an outer surface of the active layer.

6. The display device of claim 5, wherein the first light emitting element and the second light emitting element further comprise at least one contact electrode layer on end of the first semiconductor layer or the second semiconductor layer, and at least portion of a side surface of the contact electrode layer is covered by the insulating film.

7. The display device of claim 5, wherein the active layer of the first light element is located at the second end of the first light emitting element, and the active layer of the second light element is located at the second end of the second light emitting element.

8. The display device of claim 1, further comprising:

a first electrode line extending in a second direction intersect with the first direction; and a second electrode line extending in the second direction and spaced apart from the first electrode line, wherein the first light emitting element and the second light emitting element are disposed between the first electrode line and the second electrode line.

9. The display device of claim 8, wherein the first electrode line is electrically connected to the first electrode, and the second electrode line is electrically connected to the second electrode.

10. The display device of claim 1, wherein the first light emitting element and the second light emitting element each comprise an active layer disposed between a first semiconductor layer and a second semiconductor layer in the first direction.

11. The display device of claim 1, wherein the first contact electrode and the second contact electrode are spaced apart from the third contact electrode in the thickness direction by the third insulating layer.

12. The display device of claim 1, wherein the third contact electrode has a lower planar surface coplanar with and directly contacting a bottom surface of the first light emitting element at the second end, the lower planar surface of the third contact electrode extending continuously from the bottom surface of the first light emitting element at the second end in the first direction and coplanar with and directly contacting a bottom surface of the second light emitting element at the second end.

13. The display device of claim 1, wherein the first part of the third insulating layer is spaced apart from the second part by the third contact extending therebetween in the thickness direction and the first direction.

14. A display device comprising:

a first electrode and a second electrode spaced apart from each other, and the first electrode and the second electrode extending in a first direction;

a first light emitting element of which a first end is disposed on the first electrode;

a second light emitting element of which a first end is disposed on the second electrode;

a first contact electrode disposed on the first electrode and electrically contact with the first end of the first light emitting element;

a second contact electrode disposed on the second electrode and electrically contact with the first end of the second light emitting element; and a third contact electrode spaced apart from the first contact electrode and the second contact electrode, wherein the third contact electrode is electrically contact with a second end of the first light emitting element and a second end of the second light emitting element;

a third electrode spaced apart from the second electrode with therebetween the first electrode;

a third light emitting element of which a first end is disposed on the third electrode; and a fourth light emitting element of which a first end is disposed on the second electrode, wherein the second contact electrode is electrically contact with the first end of the fourth light emitting element.

15. The display device of claim 14, further comprising:

a fourth contact electrode disposed on the third electrode and electrically contact with the first end of the third light emitting element; and a fifth contact electrode spaced apart from the third contact electrode and the second contact electrode;

wherein the fifth contact electrode is electrically contact with a second end of the third light emitting element and a second end of the fourth light emitting element.

16. A display device comprising:

a first electrode and a second electrode spaced apart from each other, and the first electrode and the second electrode extending in a first direction;

a first light emitting element of which a first end is disposed on the first electrode;

a second light emitting element of which a first end is disposed on the second electrode;

a first contact electrode disposed on the first electrode and electrically contact with the first end of the first light emitting element;

a second contact electrode disposed on the second electrode and electrically contact with the first end of the second light emitting element; and a third contact electrode spaced apart from the first contact electrode and the second contact electrode, wherein the third contact electrode is electrically contact with a second end of the first light emitting element and a second end of the second light emitting element;

a third electrode spaced apart from the first electrode;

a fourth electrode spaced apart from the third electrode;

a third light emitting element of which a first end is disposed on the third electrode;

a fourth light emitting element of which a first end is disposed on the fourth electrode;

a fourth contact electrode disposed on the third electrode and electrically contact with the first end of the third light emitting element;

a fifth contact electrode disposed on the fourth electrode and electrically contact with the first end of the fourth light emitting element; and a sixth contact electrode spaced apart from the fourth contact electrode and the fifth contact electrode, wherein the sixth contact electrode is electrically contact with a second end of the third light emitting element and a second end of the fourth light emitting element.

17. The display device of claim 16, wherein a distance between the first electrode and the third electrode is greater than a distance between the first electrode and the second electrode.

18. A display device comprising:

a plurality of pair electrodes including first electrodes spaced apart from each other, and the plurality of pair electrodes comprising a first pair electrode and a second pair electrode spaced apart from the first pair electrode;

a second electrode disposed between and physically separated from the first pair electrode and the second pair electrode;

a plurality of light emitting elements of which one end is disposed on the first electrode or the second electrode;

a first contact electrode disposed on the first electrode of pair electrode and electrically contact with the light emitting element;

a second contact electrode disposed on the second electrode and electrically contact with the light emitting element; and a third contact electrode spaced apart from the first contact electrode and the second contact electrode and electrically contact with the light emitting element, wherein a distance between the first electrode and the second electrode is smaller than a distance between the first electrodes of the pair electrode.

19. The display device of claim 18, wherein the light emitting element is not disposed between the first electrodes of pair electrode.

20. The display device of claim 18, wherein the plurality of light emitting elements comprise:

a first light emitting element of which a first end is disposed on the first electrode of the first pair electrode; and a second light emitting element of which a first end is disposed on the second electrode, wherein the first end of the first light emitting element is contact with the first contact electrode, the first end of the second light emitting element is contact with the second contact electrode, and a second end of the first light emitting element and a second end of the second light emitting element are contact with the third contact electrode.

21. The display device of claim 18, further comprising:

an electrode line extending in one direction, and the second electrode is electrically connected to the electrode line.

22. The display device of claim 18, further comprising:

a first insulating layer disposed on the first electrode and the second electrode;

a second insulating layer disposed on at least portion of the light emitting elements; and a third insulating layer disposed on the second insulating layer and overlapping at least one end of the first light emitting and the second light emitting element, wherein the plurality of light emitting elements are disposed on the first insulating layer, the first contact electrode and the second contact electrode are disposed on the third insulating layer, and the third contact electrode is disposed between the second insulating layer and the third insulating layer.

23. A display device comprising:

a plurality of pair electrodes including first electrodes spaced apart from each other, and the plurality of pair electrodes comprising a first pair electrode and a second pair electrode spaced apart from the first pair electrode;

a second electrode disposed between the first pair electrode and the second pair electrode;

a plurality of light emitting elements of which one end is disposed on the first electrode or the second electrode;

a first contact electrode disposed on the first electrode of pair electrode and electrically contact with the light emitting element;

a second contact electrode disposed on the second electrode and electrically contact with the light emitting element; and a third contact electrode spaced apart from the first contact electrode and the second contact electrode and electrically contact with the light emitting element, wherein:

a distance between the first electrode and the second electrode is smaller than a distance between the first electrodes of the pair electrode;

the plurality of light emitting elements comprise:

a third light emitting element of which a first end is disposed on the first electrode of the second pair electrode; and a fourth light emitting element of which a first end is disposed on the second electrode and contact with the second contact electrode, and the display device further comprises:

a fourth contact electrode disposed on the first electrode of the second pair electrode; and a fifth contact electrode spaced apart from the second contact electrode and the fourth contact electrode.

24. The display device of claim 23, wherein the first end of the third light emitting element is contact with the fourth contact electrode, and a second end of the third light emitting element and a second end of the fourth light emitting element are contact with the fifth contact electrode.

* * * * *